(12) United States Patent
Virkar et al.

(10) Patent No.: US 10,781,324 B2
(45) Date of Patent: Sep. 22, 2020

(54) METAL NANOSTRUCTURED NETWORKS AND TRANSPARENT CONDUCTIVE MATERIAL

(71) Applicant: C3Nano Inc., Hayward, CA (US)

(72) Inventors: Ajay Virkar, San Mateo, CA (US); Ying-Syi Li, Fremont, CA (US); Xiqiang Yang, Hayward, CA (US); Melburne C. LeMieux, San Jose, CA (US)

(73) Assignee: C3Nano Inc., Hayward, CA (US)

( * ) Notice: Subject to any disclaimer, the term of this patent is extended or adjusted under 35 U.S.C. 154(b) by 47 days.

(21) Appl. No.: 15/886,201

(22) Filed: Feb. 1, 2018

(65) Prior Publication Data
US 2018/0155558 A1   Jun. 7, 2018

Related U.S. Application Data

(60) Division of application No. 13/664,159, filed on Oct. 30, 2012, now Pat. No. 9,920,207, which is a
(Continued)

(51) Int. Cl.
*C09D 11/037* (2014.01)
*H01L 31/0224* (2006.01)
(Continued)

(52) U.S. Cl.
CPC .......... *C09D 11/037* (2013.01); *C09D 11/322* (2013.01); *C09D 11/52* (2013.01);
(Continued)

(58) Field of Classification Search
CPC ..... C09D 11/037; C09D 11/322; C09D 11/52; G06F 3/041; H01B 1/02; H01L 131/022466; H01L 131/1884
See application file for complete search history.

(56) References Cited

U.S. PATENT DOCUMENTS

| 6,741,019 B1 | 5/2004 | Filas et al. |
| 7,218,004 B2 | 5/2007 | Pan et al. |

(Continued)

FOREIGN PATENT DOCUMENTS

| CN | 1399317 A | 2/2003 |
| CN | 101128550 A | 2/2008 |

(Continued)

OTHER PUBLICATIONS

Bi et al., "In situ Oxidation synthesis of AG/AGCI core-shell nanowires and their photocatalytic properties," Chem. Commun. (2009), pp. 6551-6553.
(Continued)

*Primary Examiner* — Timothy J Thompson
*Assistant Examiner* — Amol H Patel
(74) *Attorney, Agent, or Firm* — Christensen, Fonder, Dardi & Herbert PLLC; Peter S. Dardi

(57) ABSTRACT

Metal nanowires, such as silver nanowires coated on a substrate were sintered together to form fused metal nanowire networks that have greatly improved conductivity while maintaining good transparency and low haze. The method of forming such a fused metal nanowire networks are disclosed that involves exposure of metal nanowires to various fusing agents on a short timescale. The resulting sintered network can have a core-shell structure in which metal halide forms the shell. Additionally, effective methods are described for forming patterned structure with areas of sintered metal nanowire network with high conductivity and areas of un-sintered metal nanowires with low conductivity. The corresponding patterned films are also described. When formed into a film, materials comprising the metal nanowire network demonstrate low sheet resistance while maintaining desirably high levels of optical transparency with low haze,
(Continued)

making them suitable for transparent electrode, touch sensors, and other electronic/optical device formation.

21 Claims, 16 Drawing Sheets

Related U.S. Application Data continuation-in-part of application No. 13/530,822, filed on Jun. 22, 2012, now Pat. No. 10,029,916.

(60) Provisional application No. 61/684,409, filed on Aug. 17, 2012.

(51) Int. Cl.
  *H01B 1/02* (2006.01)
  *G06F 3/041* (2006.01)
  *H01L 31/18* (2006.01)
  *C09D 11/322* (2014.01)
  *C09D 11/52* (2014.01)

(52) U.S. Cl.
  CPC .............. *G06F 3/041* (2013.01); *H01B 1/02* (2013.01); *H01L 31/022466* (2013.01); *H01L 31/1884* (2013.01); *G06F 2203/04103* (2013.01); *Y02E 10/50* (2013.01)

(56) References Cited

U.S. PATENT DOCUMENTS

| | | |
|---|---|---|
| 7,849,424 B2 | 12/2010 | Wolk et al. |
| 7,902,639 B2 | 3/2011 | Garrou et al. |
| 7,922,787 B2 | 4/2011 | Wang et al. |
| 8,018,563 B2 | 9/2011 | Jones et al. |
| 8,018,568 B2 | 9/2011 | Allemand et al. |
| 8,031,180 B2 | 10/2011 | Miyamoto et al. |
| 8,049,333 B2 | 11/2011 | Alden et al. |
| 8,052,773 B2 | 11/2011 | Takada |
| 8,094,247 B2 | 1/2012 | Allemand et al. |
| 8,174,667 B2 | 5/2012 | Allemand et al. |
| 8,198,796 B2 | 6/2012 | Takada |
| 9,150,746 B1 | 10/2015 | Li et al. |
| 9,183,968 B1 | 11/2015 | Li et al. |
| 9,396,843 B2 | 7/2016 | Chung et al. |
| 10,026,518 B2 | 6/2018 | Sepa et al. |
| 10,020,807 B2 | 7/2018 | Virkar et al. |
| 10,100,213 B2 | 10/2018 | Li et al. |
| 2003/0022518 A1 | 1/2003 | Munakata et al. |
| 2005/0074589 A1 | 4/2005 | Pan et al. |
| 2005/0196707 A1 | 9/2005 | Cok |
| 2005/0214480 A1 | 9/2005 | Garbar et al. |
| 2005/0215689 A1 | 9/2005 | Garbar et al. |
| 2006/0052947 A1 | 3/2006 | Hu |
| 2006/0083694 A1 | 4/2006 | Kodas et al. |
| 2006/0163744 A1 | 7/2006 | Vanheusden et al. |
| 2006/0205240 A1 | 9/2006 | Pan et al. |
| 2006/0286785 A1 | 12/2006 | Rogers et al. |
| 2007/0074316 A1 | 3/2007 | Alden et al. |
| 2008/0003130 A1 | 1/2008 | Xia et al. |
| 2008/0034921 A1 | 2/2008 | Vanheusden et al. |
| 2008/0050513 A1 | 2/2008 | Wang et al. |
| 2008/0143906 A1 | 6/2008 | Allemand et al. |
| 2008/0147019 A1 | 6/2008 | Song et al. |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0286488 A1 | 11/2008 | Li et al. |
| 2008/0292979 A1 | 11/2008 | Ding et al. |
| 2008/0317982 A1 | 12/2008 | Hecht et al. |
| 2009/0011147 A1 | 1/2009 | Dictus |
| 2009/0052029 A1 | 2/2009 | Dai et al. |
| 2009/0088326 A1 | 4/2009 | Baecker |
| 2009/0098405 A1 | 4/2009 | Matsunami |
| 2009/0129004 A1 | 5/2009 | Gruner |
| 2009/0130433 A1 | 5/2009 | Takada |
| 2009/0166055 A1 | 7/2009 | Guiheen et al. |
| 2009/0196788 A1 | 8/2009 | Wang et al. |
| 2009/0214766 A1 | 8/2009 | Magdassi et al. |
| 2009/0223703 A1 | 9/2009 | Winoto |
| 2009/0242231 A1 | 10/2009 | Miyagisima et al. |
| 2009/0283304 A1 | 11/2009 | Winoto |
| 2009/0301769 A1 | 12/2009 | Seppa et al. |
| 2009/0305437 A1 | 12/2009 | Allemand et al. |
| 2009/0311530 A1 | 12/2009 | Hirai et al. |
| 2009/0317435 A1 | 12/2009 | Vandesteeg et al. |
| 2009/0321113 A1 | 12/2009 | Allemand et al. |
| 2009/0321364 A1 | 12/2009 | Spaid et al. |
| 2010/0078197 A1 | 4/2010 | Miyagishima et al. |
| 2010/0078602 A1 | 4/2010 | Hosoya et al. |
| 2010/0140564 A1 | 6/2010 | Overbeek et al. |
| 2010/0200407 A1 | 8/2010 | Garbar et al. |
| 2010/0243295 A1 | 9/2010 | Allemand et al. |
| 2010/0307792 A1 | 12/2010 | Allemand et al. |
| 2011/0024159 A1 | 2/2011 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0062389 A1 | 3/2011 | Wang et al. |
| 2011/0088770 A1 | 4/2011 | Allemand et al. |
| 2011/0094651 A1 | 4/2011 | Kuriki |
| 2011/0095275 A1 | 4/2011 | Li et al. |
| 2011/0151211 A1 | 6/2011 | Chang et al. |
| 2011/0162870 A1 | 7/2011 | Markowich et al. |
| 2011/0163403 A1 | 7/2011 | Bhatia et al. |
| 2011/0174190 A1 | 7/2011 | Sepa et al. |
| 2011/0183128 A1 | 7/2011 | Magdassi et al. |
| 2011/0192633 A1 | 8/2011 | Allemand |
| 2011/0253668 A1 | 10/2011 | Winoto et al. |
| 2011/0281070 A1* | 11/2011 | Mittal ............... H01L 31/02246 428/142 |
| 2011/0285019 A1 | 11/2011 | Alden et al. |
| 2011/0297642 A1 | 12/2011 | Allemand et al. |
| 2012/0033367 A1 | 2/2012 | Jones et al. |
| 2012/0034129 A1 | 2/2012 | Suh et al. |
| 2012/0073947 A1 | 3/2012 | Sakata et al. |
| 2012/0097059 A1 | 4/2012 | Allemand et al. |
| 2012/0103660 A1 | 5/2012 | Gupta et al. |
| 2012/0104374 A1* | 5/2012 | Allemand ................ H01B 1/02 257/40 |
| 2012/0107598 A1 | 5/2012 | Zou et al. |
| 2012/0127097 A1 | 5/2012 | Gaynor et al. |
| 2012/0127113 A1 | 5/2012 | Yau et al. |
| 2012/0132930 A1 | 5/2012 | Young et al. |
| 2012/0138913 A1 | 6/2012 | Alsayed et al. |
| 2012/0152135 A1 | 6/2012 | Stebbins et al. |
| 2012/0168684 A1 | 7/2012 | Magdassi et al. |
| 2012/0183768 A1 | 7/2012 | Kondo et al. |
| 2012/0217453 A1 | 8/2012 | Lowenthal et al. |
| 2012/0223358 A1 | 9/2012 | Pschenitzka |
| 2012/0249453 A1* | 10/2012 | Tsukamoto ............. G06F 3/041 345/173 |
| 2013/0000952 A1 | 1/2013 | Srinivas et al. |
| 2013/0001478 A1 | 1/2013 | Allemand et al. |
| 2013/0056244 A1 | 3/2013 | Srinivas et al. |
| 2013/0071557 A1 | 3/2013 | Haymov et al. |
| 2013/0146335 A1 | 6/2013 | Gambino et al. |
| 2013/0153829 A1 | 6/2013 | Kondo et al. |
| 2013/0189502 A1 | 7/2013 | Takashi et al. |
| 2013/0266795 A1 | 10/2013 | Schultz et al. |
| 2013/0291683 A1 | 11/2013 | Sepa et al. |
| 2013/0341074 A1 | 12/2013 | Virkar et al. |
| 2013/0342221 A1 | 12/2013 | Virkar et al. |
| 2014/0004371 A1 | 1/2014 | Chung et al. |
| 2014/0054515 A1 | 2/2014 | Lowenthal et al. |
| 2014/0099486 A1 | 4/2014 | Ollmann et al. |
| 2014/0238833 A1 | 8/2014 | Virkar et al. |
| 2014/0255707 A1 | 9/2014 | Philip, Jr. et al. |
| 2014/0262454 A1 | 9/2014 | Zou et al. |
| 2014/0374146 A1 | 12/2014 | Saito et al. |
| 2015/0017457 A1 | 1/2015 | Mizuno et al. |

(56) References Cited

U.S. PATENT DOCUMENTS

| | | |
|---|---|---|
| 2015/0036276 A1 | 2/2015 | Kaneko et al. |
| 2015/0104936 A1 | 4/2015 | Markovich et al. |
| 2015/0144380 A1 | 6/2015 | Yang et al. |
| 2015/0206623 A1 | 7/2015 | Poon |
| 2015/0208498 A1 | 7/2015 | Poon |
| 2015/0321257 A1 | 11/2015 | Suh et al. |
| 2016/0096967 A1 | 4/2016 | Virkar et al. |
| 2016/0108256 A1 | 4/2016 | Yang et al. |
| 2016/0122562 A1 | 5/2016 | Yang et al. |
| 2017/0015857 A1 | 1/2017 | Kodama et al. |

FOREIGN PATENT DOCUMENTS

| | | |
|---|---|---|
| CN | 101522947 A | 9/2009 |
| CN | 101589473 A | 11/2009 |
| CN | 102131602 A | 7/2011 |
| CN | 102193697 A | 9/2011 |
| CN | 102250506 A | 11/2011 |
| CN | 102544223 A | 7/2012 |
| CN | 102686777 A | 9/2012 |
| CN | 102763171 A | 10/2012 |
| CN | 102819338 A | 12/2012 |
| CN | 102819341 A | 12/2012 |
| CN | 102834472 A | 12/2012 |
| CN | 102883822 A | 1/2013 |
| CN | 102971805 A | 3/2013 |
| CN | 103380466 A | 10/2013 |
| CN | 103827790 A | 5/2014 |
| CN | 104508758 A | 4/2015 |
| JP | 2009-129882 A | 6/2009 |
| JP | 5289859 B2 | 2/2010 |
| JP | 2011-119142 A | 6/2011 |
| JP | 2011-210454 A | 10/2011 |
| JP | 2012-009383 A | 1/2012 |
| JP | 2012-022844 A | 2/2012 |
| JP | 2012-216535 A | 11/2012 |
| JP | 2013-084628 A | 5/2013 |
| JP | 2013-518974 A | 5/2013 |
| JP | 2016-519206 A | 6/2016 |
| KR | 10-2007-0029151 | 3/2007 |
| KR | 10-2010-0098448 A | 9/2010 |
| KR | 10-2012-0030407 A | 3/2012 |
| KR | 10-2012-0086635 A | 8/2012 |
| KR | 2013-0027634 A | 3/2013 |
| KR | 2013-0102723 A | 9/2013 |
| TW | 2009-23971 A | 6/2009 |
| TW | 2009-39251 A | 9/2009 |
| TW | 2011-10144 A | 3/2011 |
| TW | 2011-37062 A | 11/2011 |
| TW | 2012-36967 A1 | 9/2012 |
| WO | 2005-005687 A1 | 1/2005 |
| WO | 2006-072959 A1 | 7/2006 |
| WO | 2008-046058 A2 | 4/2008 |
| WO | 2009-035059 A1 | 3/2009 |
| WO | 2009-086161 | 7/2009 |
| WO | 2009-156990 | 12/2009 |
| WO | 2010-036113 A1 | 4/2010 |
| WO | 2010-109465 A1 | 9/2010 |
| WO | 2010-129604 A1 | 11/2010 |
| WO | 2011-008227 A1 | 1/2011 |
| WO | 2011-097470 A2 | 8/2011 |
| WO | 2011-106730 A2 | 9/2011 |
| WO | 2012-083082 A1 | 6/2012 |
| WO | 2012-168941 A1 | 12/2012 |
| WO | 2013-006349 A1 | 1/2013 |
| WO | 2013-040245 A2 | 3/2013 |
| WO | 2013-047556 A1 | 4/2013 |
| WO | 2013-056242 A1 | 4/2013 |
| WO | 2013-094926 A1 | 6/2013 |
| WO | 2013-095971 A1 | 6/2013 |
| WO | 2013-128458 A1 | 9/2013 |
| WO | 2013-133272 A1 | 9/2013 |
| WO | 2013-133285 A1 | 9/2013 |
| WO | 2014-127909 A1 | 8/2014 |
| WO | 2014-133890 A2 | 9/2014 |
| WO | 2015-077145 A2 | 5/2015 |

OTHER PUBLICATIONS

De et al., "Silver Nanowire Networks as Flexible, Transparent Conducting Films: Extremely High DC to Optical Conductivity Ratio," ACS Nano, 3(7):1767-1774 (Jun. 2009).
Garnett et al., "Self-limited Plasmonic Welding of Silver Nanowire Junctions," Nature Materials, vol. 11, p. 241-249, Mar. 2012.
Grouchko et al., "Conductive Inks with 'built-in' mechanism that enables sintering at room temperature," ACS Nano, 5(4):3354-3359 (2011).
Hu et al., "Scalable coating properties of flexible, silver nanowire electrodes," ACS Nano, 4(5):2955-2963 (2010).
Lam et al., "Self-diffusion in silver at low temperatures," Phys. Stat. Sol. (b), 57 (1973), p. 225-236.
Liu et al., "Silver Nanowire-Based Transparent, Flexible and Conductive Thin Film," Nanoscale Research Letters, vol. 6(75), Jan. 2011, 8 pages.
Luo et al., "Size effect on thermodynamic properties of silver nanoparticles," J. Phys. Chem. C, 112 (2008), pp. 2359-2369.
Magdassi et al., "Triggering the Sintering of Silver Nanoparticles at Room Temperature," ACS Nano, 4(4):1943-1948 (2010).
Nanda, et al., "Higher surface free energy of free nanoparticles," Phys. Rev. Letters, 91(10):106102-1 (2003).
Pothoven, "Laser Patterning of Silver Nanowires," Information Display Magazine, Sep. 2012, 28(9), (10 pages).
Raaen, A.M., "Diffusion in silver fluoride," Physical Review B, 21(10):4895-4897 (1980).
Redmond et al., "Electrochemical Ostwald ripening of colloidal Ag particles on conductive substrates," Nano Letters, 5(1):131-135 (2005).
Safaei et al., "Modeling the Melting Temperature of Nanoparticles by an Analytical Approach," J. Phys. Chem. C, 112 (2008), pp. 99-105.
Spechler et al., "Direct Write Pulsed Laser Processed Silver Nanowire Networks for Transparent Conducting Electrodes," Springer-Verlag, vol. 108, pp. 25-28, May 10, 2012.
Sun et al., "AgCI nanoparticle nanowires fabricated by template method," Materials Letters, 61 (2007), pp. 1645-1648.
Tokuno et al., "Fabrication of Silver Nanowire Transparent Electrodes at Room Tempature," Nano Research, (2011), 4(12): 1215-1222.
Van Heyningen, R., "Electron Drift Mobility in Silver Chloride," Physical Review, (Dec. 1, 1962), pp. 2112-2118.
Yan et al., "Recent Research Progress On Preparation of Silver Nanowires By Soft Solution Method," Rev. Adv. Mater. Sci. 24, (2010), pp. 10-15.
Zhu et al., "Transferable Sefl-welding Silver Nanowire Network as High Performance Transparent Flexible Electrode," Nanotechnology 24, (Jul. 26, 2013), 24(335202): 1-7.
International Search Report and Written Opinion for co-pending application PCT/US2013/046866 dated Dec. 27, 2013 (15 pages).
European communication from corresponding European Application No. 13806288.0 dated Mar. 8, 2017 (8 pages).
Japanese office action from corresponding Japanese Application No. 2015-518580 dated Feb. 28, 2017 (6 pages).
Allen, "Photoinitiators for UV and visible curing of coatings: mechanisms and properties", Journal of Photochemistry and Photobiology A Chemistry, vol. 100, (1996) p. 101-107.
Bermocoll® E 230 FQ Product Information, Akzo Nobel Chemicals AG, Performance Additives, www.akzonobel.com/pa.
Cambrios Archived Website, ClearOhm, "High Performance Transparent Conductive Material", Cambrios Technologies Corporation, Nov. 2010.
Chen et al., "Polysaccharide Hydrogenls for Protein Drug Delivery", Carbohydrate Polymers, 28, (1995), p. 69-76.
Coskun et al., "Optimization of silver nanowire networks for polymer light emitting diode electrodes", Nanotechnology, 24, 125202, (2013) p. 1-9.

(56) References Cited

OTHER PUBLICATIONS

Ducamp-Sanguesa et al. "Synthesis and Characterization of Fine and Monodisperse Silver Particles of Uniform Shape", Journal of Solid State Chemistry, vol. 100 pp. 272-280 (1992).
Gu, Shouwu, "The Creation of Nanojunctions", The Royal Society of Chemistry, Nanoscale, (2010), 2, pp. 2521-2529.
Hu et al., "Metal nanogrids, nanowires, and nanofibers for transparent electrodes", MRS Bulletin, vol. 36, p. 1-7, Oct. 2011.
Imam et al., "Biobased adhesives, gums, emulsions, and binders: current trends and future prospects", Journal of Adhesion Science and Technology, vol. 27, Nos. 18-19, 1972-1997, (2013).
Kang et al., "Halide Welding for Silver Nanowire Network Electrode," ACS Applied Materials & Interfaces 2017, 9, 30779-30785, Apr. 18, 2017.
Kang et al., "Epitaxial-Growth-Induced Junction Welding of Silver Nanowire Network Electrodes" CS Nano 2018, 12, 4894-4902, Apr. 2018.
Khanarian et al., "The Optical and Electrical Properties of Silver Nanowire Mesh Films", Journal of Applied Physics, 114(024302), doi: 10.1063/1.4812390, (2013).
Kim et al., "Large Discrete Resistance Jump at Grain Boundary in Copper Nanowire", American Chemical Society Nano Letters 2010, 10, 3096-3100, Jul. 7, 2010.
Kumar et al., "Silver nanowire based flexible electrodes with improved properties: High conductivity, transparency, adhesion and low haze", Material Research Bulletin, vol. 48, (2013), p. 2944-2949.
Kunjappu, "Ink Chemistry", www.chemistryworld.com/news/ink-chemistry/3002158.article, p. 1-18, Feb. 20, 2019.
Lu et al., "Cold Welding of Ultrathin Gold Nanowires", Nature Nanotechnology, vol. 5, p. 1-7, Mar. 2010.
Ma et al., "Synthesis of small silver nanocubes in a hydrophobic solvent by introducing oxidative etching with Fe(III) species†", Journal of Materials Chemistry 2010, 20, 3586-3589, Apr. 9, 2010.
Madaria et al., "Uniform, Highly Conductive, and Patterned Transparent Films of a Percolating Silver Nanowire Network on Rigid and Flexible Substrates Using a Dry Transfer Technique", NanoRes, (2010) 3: 564-573.
Martin et al., "Hydrophilic Matrix Tablets for Oral Controlled Release", AAPS Advances in the Pharmaceutical Sciences Series 16, DOI 10.1007/978-1-4939-1519-4_5. (2014).
Poole, C.F., "Pyrolysis Gas Chromatography", Gas Chromatography, Chapter 11, Elservier Inc., (2012).
Sun et al., "Crystalline Silver Nanowires by Soft Solution Processing", ACS Nano Letters 2002, vol. 2 No. 2, 165-168, Jan. 3, 2002.
Wang et al., "Water-Soluble Ethylhydroxyethyl Cellulose Prevents Bacterial Translocation Induced by Major Liver Resection in the Rat", Annals of Surgery, vol. 217 No. 2, p. 155-167, (1993).
Wiley et al., "Polyol Synthesis of Silver Nanostructures: Control of Product Morphology with Fe(II) or Fe(III) Species", ACS Journal of Surfaces and Colloids, vol. 21 No. 18, 8077-8080, Aug. 30, 2005.
European communication from corresponding European Application No. 13806288.0 dated Nov. 26, 2018.
Korean Second Notice of Preliminary Rejection from corresponding Korean Application No. 10-2015-7001771, based on PCT/US2013/046866, dated May 3, 2019.
Preliminary Rejection from corresponding Korean Patent Application No. 10-2019-7028001 dated Oct. 14, 2019.
Communication from corresponding European Application No. 19200682.3-1105 dated Dec. 5, 2019.

* cited by examiner

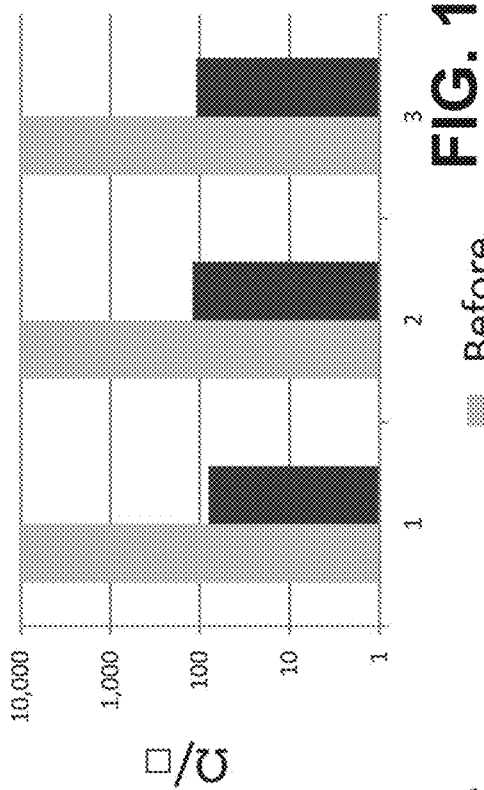
FIG. 10A
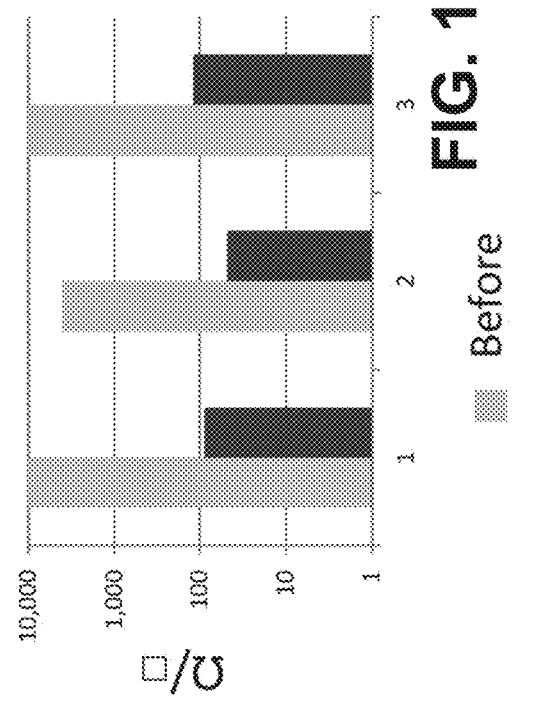
FIG. 10B
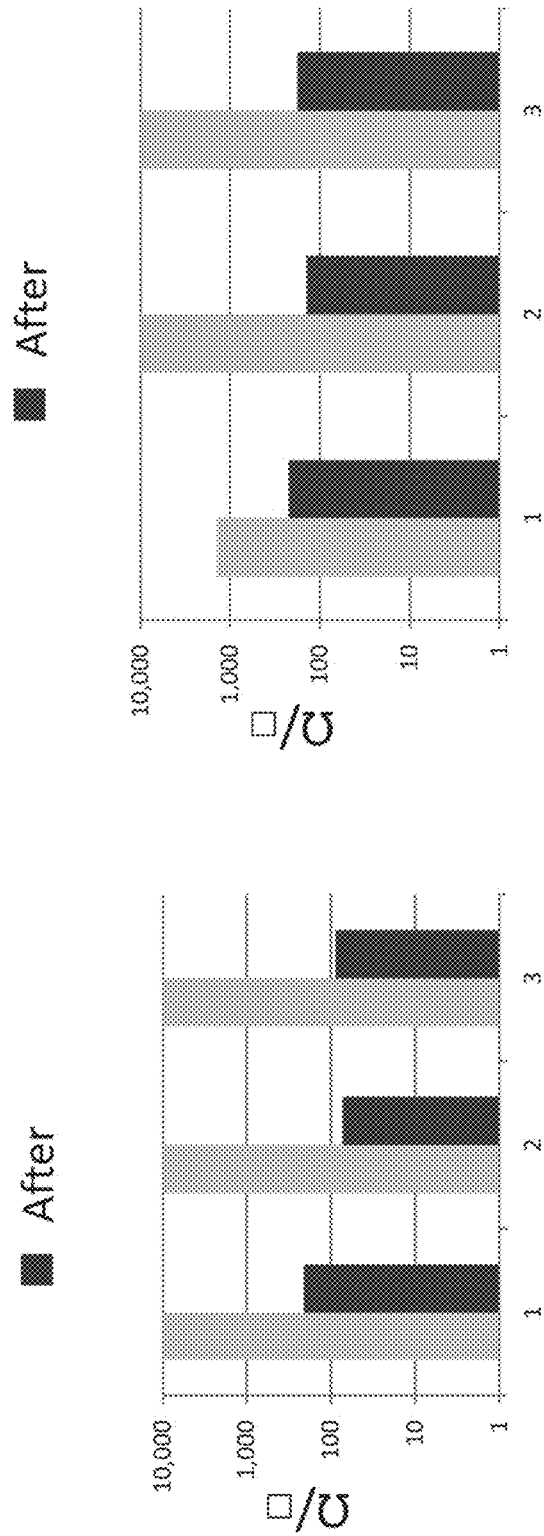
FIG. 11A
FIG. 11B

METAL NANOSTRUCTURED NETWORKS AND TRANSPARENT CONDUCTIVE MATERIAL

CROSS REFERENCE TO RELATED APPLICATIONS

This application is divisional of U.S. patent application Ser. No. 13/664,159 filed on Oct. 30, 2012 to Virkar et al., entitled "Metal Nanostructured Networks and Transparent Conductive Material," which is a continuation-in-part application of U.S. patent application Ser. No. 13/530,822 filed on Jun. 22, 2012 to Virkar et al., entitled "Metal Nanowire Networks and Transparent Conductive Material" and claims priority to U.S. provisional patent application Ser. No. 61/684,409 filed on Aug. 17, 2012 to Virkar et al., entitled "Metal Nanowire Films with Good Conductivity and Transmission with Low Haze", all of which are incorporated herein by reference.

FIELD OF THE INVENTION

The invention relates to fused networks of metal nanowires that are suitable for the formation of electrically conductive and transparent films, such as for use as transparent electrodes. The inventions are further related to chemical methods for fusing the nanowires to form networks as well as to devices incorporating the fused metal nanowire networks.

BACKGROUND

Functional films can provide important functions in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates.

SUMMARY OF THE INVENTION

In a first aspect, the invention pertains to a precursor ink that comprises a solvent, at least about 0.01 weight percent metal nanowires and from about 0.05 mM to about 50 mM halide anions. In some embodiments, the precursor ink can comprise from about 0.025 to about 2 weight percent metal nanowires and from about 0.25 mM to about 10 mM halide anions. In some embodiments, the metal nanowires in the precursor ink are silver nanowires. The silver nanowires can have an average diameter of no more than about 75 nm and a length of at least about 5 microns. In some embodiments, the solvent of the precursor ink can comprise alcohol and/or water. In some embodiments, the invention pertains to a method for forming a transparent conductive film that comprises depositing a precursor ink described herein and drying the deposited ink to form the film.

In a second aspect, the invention pertains to a material that comprises a transparent conductive coating and a substrate on which the coating is supported. The coating comprises a sintered metal nanowire network that comprises sintered metal nanowires. The coating has a transparency to visible light of at least about 90%, a sheet resistance of no more than about 500 Ohms/square, and a haze of no more than 0.5. In some embodiments, the coating of the material has a sheet resistance of no more than about 200 Ohms/square. The substrate of the material can comprise a polymer film. In some embodiments, the sintered metal nanowires of the material comprise sintered silver nanowires. The sintered metal network comprises a metal halide shell layer. In some embodiments, the transparent conductive coating of the material can have a transparency to visible light of at least about 95%, a surface loading level of the sintered metal network from about 0.1 micrograms/$cm^2$ to about 5 mg/$cm^2$ and a haze of no more than about 0.4.

In a third aspect, the invention pertains to a material that comprises a transparent conductive coating and a substrate on which the coating is supported. The coating comprises a sintered metal nanowire network with a metal halide shell layer having an average thickness of at least about 1 nanometer over a metallic core. In some embodiments, the sintered metal network of the material comprises sintered silver nanowires. The coating of the material has a transparency of at least about 90% of visible light and a sheet resistance of no more than about 200 Ohms/square. In some embodiments, the sintered silver nanowires of the material have an average diameter of no more than about 75 nm and an average length of at least about 5 microns and the material has a surface loading level of the sintered silver nanowires from about 0.1 micrograms/$cm^2$ to about 5 mg/$cm^2$.

In a fourth aspect, the invention pertains to a patterned structure that comprises a substrate and a coating, wherein the coating is patterned with un-sintered metal nanowires in a selected portion of the coating and a sintered metal nanowire network over another portion of the coating. The coating portion with the sintered metal nanowire network has a sheet resistance of no more than about 500 Ohms/square and the portion with un-sintered metal nanowires has a sheet resistance at least about 5 times less than the sheet resistance of the sintered metal nanowire network. The coating of the patterned structure has a transparency to visible light of at least about 85% and the coating has approximately the same transparency across the entire coating. In some embodiment, the un-sintered metal nanowires in the coating of the patterned structure comprise silver nanowires. The un-sintered metal nanowires have a sheet resistance at least about 1000 times the sheet resistance of the sintered metal network In a fifth aspect, the invention pertains to a method for forming a patterned structure that comprises a substrate and a metal nanowire coating. The method comprises selectively contacting a selected portion of the metal nanowire coating with a sintering agent to form a patterned coating with the selected portion having a sheet resistance at least about 5 times greater than the sheet resistance of unselected portion of the metal nanowire coating. In some embodiments, the selective contacting of the method comprises directing a sintering vapor to the selected portion of the coating to form the patterned structure. In some embodiments, the method further comprises blocking the sintering vapor with a mask over the unselected portion of the coating. In other embodiments, the selective contacting of the method comprises directing a solution comprising a sintering agent at the selected portion of the coating to form the patterned structure.

In a sixth aspect, the invention pertains to a touch sensor that comprises a first electrode structure and a second electrode structure spaced apart in a natural configuration. The first electrode structure generally comprises a first transparent conductive electrode comprising a first sintered nanostructured metal network on a first substrate. In some embodiments, the second electrode structure can comprise a second transparent conductive electrode comprising a second sintered nanostructured metal network on a second substrate. The first electrode structure and the second electrode structure can be spaced apart by a dielectric layer and the electrode structures can be connected to a circuit to measure changes in capacitance. In some embodiments, the touch sensor can further comprise display components associated with the substrate. The substrates of the touch sensor can be transparent sheets. The touch sensor may comprise a circuit connected to the electrode structures that measures changes in electrical resistance or capacitance.

BRIEF DESCRIPTION OF THE DRAWINGS

FIGS. 10A and 10B are plots of conductivity of the film samples before and after the sintering respectively from Example 5 plotted in logarithmic scale.

FIGS. 11A and 11B are plots of conductivity of the film samples before and after the sintering respectively from Example 6 plotted in logarithmic scale.

DETAILED DESCRIPTION OF PREFERRED EMBODIMENTS

Figure 1A:
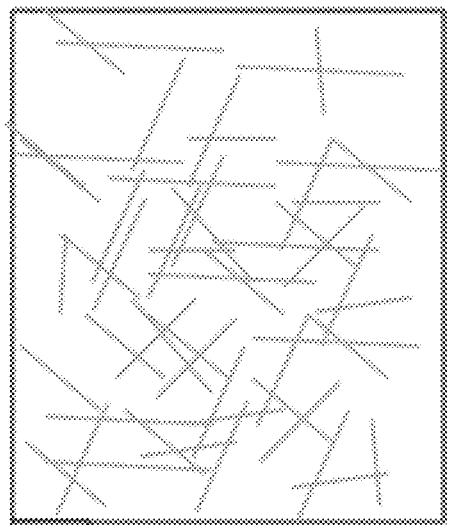
FIG. 1A is a schematic drawing of metal grid based transparent electrode formed through a traditional patterning approach.

A fused or sintered metal nanowire network can be formed chemically to achieve a structure with desirably low electrical resistance and high transparency to visible light. The fused metal nanowire network can be formed as a coating for use as a transparent conductive layer. Silver nanowire can be a convenient material to form the network, but other metal nanowires are also suitable for forming the network of fused metal nanowires. The chemical fusing or sintering can be performed using gas phase or solution phase ionic inorganic compositions with halogen anions. A solution with halogen anions can be delivered to a metal nanowire coating or combined with a nanowire dispersion for the direct application as a coating with the metal nanowires co-deposited with the halogen sintering agent. Since the electrically conductive network can be formed at low temperature, the networks are suitable for use with materials, such as polymers, that cannot tolerate high temperatures. It has been found that some of the processing approaches can be adapted for efficient patterning with sintered regions and un-sintered regions along the surface to provide for selected electrical conduction pathways along the surface while providing good optical transparency across the surface. Thus, the conductive networks are well suited to certain transparent electrode applications and the low quantities of materials and low temperature processing can provide for convenient commercial applications. The sintered metal nanowire networks can form transparent electrically conductive films with low haze, which is significant for many applications.

Metal nanowires can be formed from a range of metals. For example, the production of a range of metal nanowires is described, for example, in published U.S. patent application 2010/0078197 to Miyagishima et al., entitled "Metal Nanowires, Method for Producing the Same, and Transparent Conductor," incorporated herein by reference. There has been particular interest in silver nanowires due to the high electrical conductivity of silver. With respect to the specific production of silver nanowires, see for example, published U.S. patent application 2009/0242231 to Miyagisima et al., entitled "Silver Nanowire, Production Methods Thereof, and Aqueous Dispersion," and U.S. 2009/0311530 to Hirai et al., entitled "Silver Nanowire, Production Method Thereof, and Aqueous Dispersion," and U.S. Pat. No. 7,922,787 to Wang et al., "Methods for the Production of Silver Nanowires," all three of which are incorporated herein by reference. Silver nanowires are commercially available, for example, from Seashell Technologies, LLC, CA, USA.

Silver is known to have a bulk melting point of about 960° C. However, nanoparticles of silver can melt at temperatures less than 150° C. This melting point depression observed for the nanoparticles are believed to be based on the large surface area/volume ratios of the nanoparticles. In general, the larger the surface area/volume ratio, the greater the expected mobility of the surface atoms, and the lower the melting point. Melting points of about 150° C. for silver nanoparticles however may still be too high for a variety of substrates including plastics and elastomers. The time required for melting and cooling can also be in excess of several minutes, which add time and process costs to production.

To produce flexible transparent conductive material that can be produced at reasonable cost and in large scale such as roll-to-roll coating or ink-jet printing method, numerous new materials have been developed as replacements for indium tin oxide (ITO). A potential ITO replacement is a metal-grid shown in FIG. 1A. Metal grids, which can be formed using patterning approaches such as photolithography, can achieve very high performances with low sheet resistances. However, the metal grid films are not solution-processable for example with roll-to-roll coating and therefore are costly to fabricate and often involve fabrication methods which are difficult to scale. While the performance of metal grids may exceed ITO, cost and processability are still hindering their wide-spread adoption.

Figure 1B:
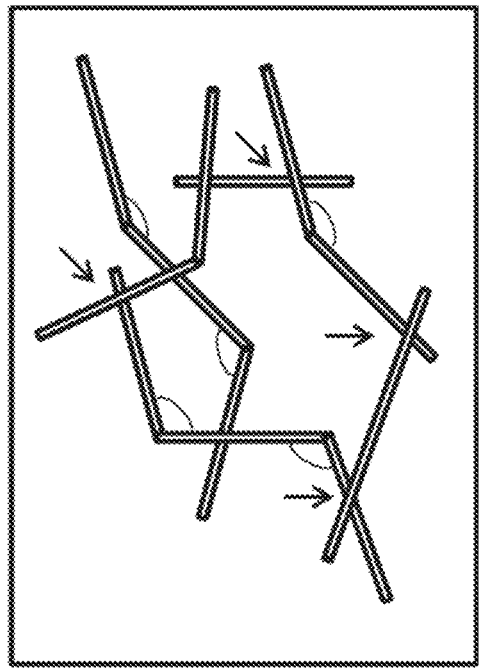
FIG. 1B is a schematic drawing of a nanowire (NW) based transparent conductive material fabricated from low cost solution processable methods disclosed herein.

As shown schematically in FIG. 1B, the metal nanowires deposited into a film from a dispersion can appear to be randomly arrayed rods that intersect with each other randomly, although in practice some alignment of rods can take place depending on the deposition process. While metal nanowires are inherently electrically conducting, the vast majority of resistance in the silver nanowires based films is believed to due to the junctions between nanowires. To improve the properties, it has been proposed to embed the metal nanowires in a secondary electrically conductive medium, see published U.S. patent application 2008/0259262 to Jones et al., entitled "Composite Transparent Conductors and Methods of Forming the Same," incorporated herein by reference. In principle, the junction resistance of a AgNW network can be reduced by sintering or fusing the wires together using heat as disclosed in "Modeling the melting temperature of nanoparticles by an analytical approach." by A. Safaei et. Al. in J. Phys. Chem. C, 2008, 112, 99-105 and in "Size effect on thermodynamic properties of silver nanoparticles" by W. Luo et al. in J. Phys. Chem. C, 2008, 112, 2359-69. The heat can be applied conventionally or by a light source. However, conventional heating may not be practical for many applications since the NWs are not expected to melt until 300-400° C., which is significantly greater than the thermal stability limits of most plastic substrates. Light sources can also be used, but may involve setup of additional and expensive equipment in a large roll-to-roll fabrication. A room or low temperature process which fuses or sinters the NWs is therefore highly desirable. Hu et al. disclosed similar results in ACS Nano, Vol 4, No. 5, 2010, 2955-2963 entitled "Scalable coating properties of flexible, silver nanowire electrodes." Hu et al demonstrated that the junction resistance between the silver nanowires can be in the giga-ohm range, but with processing to 110° C. with the optional addition of significant pressures for short times improved electrical conductivity performance could be obtained.

Low temperature in combination with the application of pressure has been used to achieve a significant decrease in electrical resistance while reasonable levels of transparency were reported. See, De et al., "Silver Nanowire Networks as Flexible, Transparent Conducting Films: Extremely High DC to Optical Conductivity Ratio," ACS Nano Vol. 3(7), pp 1767-1774 (June 2009). The De et al. article does not suggest that fusing of the silver nanowires takes place, and the low temperature used in the process would seem to be too low to result in fusing. The process in the De et al. article involved vacuum filtering and transfer using 100° C. and significant amounts of pressure for 2 hours. This process is not desirable from a commercial processing perspective.

Figure 1C:
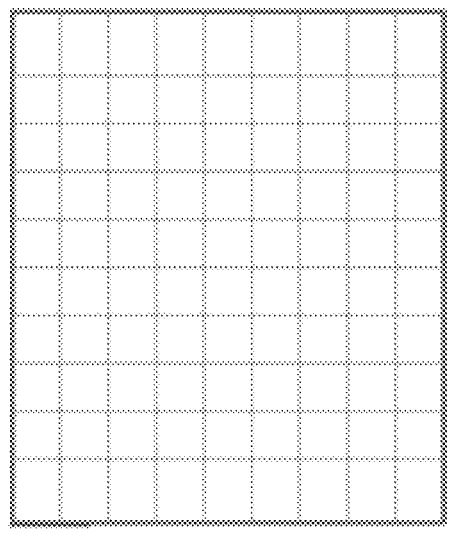
FIG. 1C is a schematic drawing illustrating the process of three nanowires being fused together to form an elongated nanowire with two angles around the fused points.
Figure 1D:
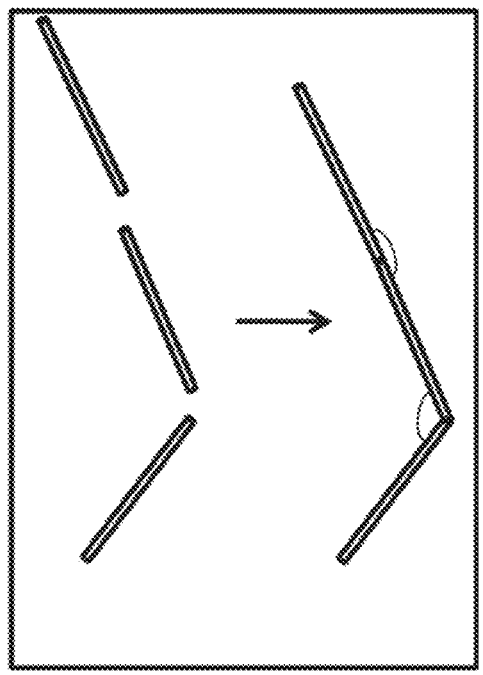
FIG. 1D is a schematic drawing illustrating nanowires being fused together to form a fused NW based transparent conductive material with angles around the fused points and arrows indicating the formation of NW network.
Figure 1E:
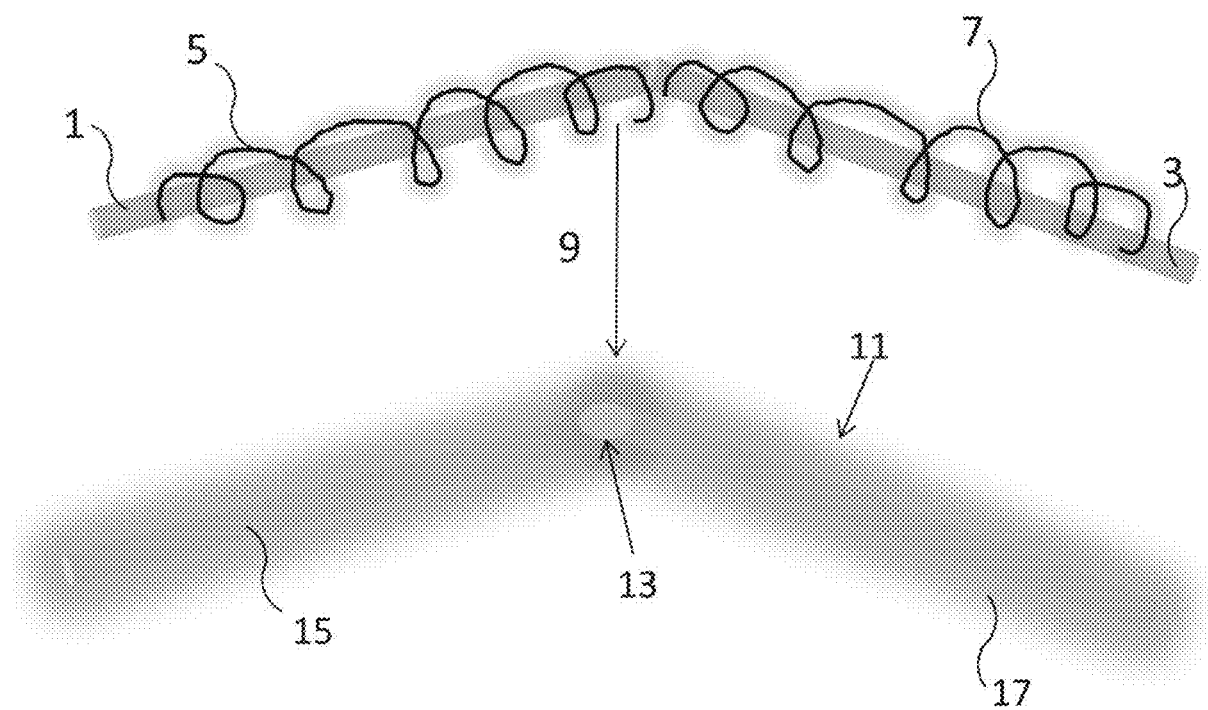
FIG. 1E is a schematic diagram showing the process of bonding nanowires with sintering agent.

As described herein metal nanowires are sintered or bonded together at room temperature, or more generally at temperatures less than about 80° C., to produce materials comprising bonded metal nanowire networks that have greatly decreased sheet resistance relative to the unbonded metal nanowire structures. The sintering chemistry forms a core-shell structure that has improved conductivity and transmission compared to the unbound nanowires. The metal cores of adjacent nanowires are sintered together to form a bond and a shell of metal halide covers the wires along the network structure. Due to the metal halide coating, the core-shell material can have altered optical properties. In particular, a lower reflectivity results from the metal halide shell that may improve optics for certain applications. Alternatively, the metal halide shell can be dissolved following sintering of the metal nanowires to remove any optical effects of the shell. The core shell structure can be understood based on the elucidation of the chemistry resulting in the sintering and can be confirmed through examination of micrographs, as described further below. Referring to FIG. 1E, nanowires 1 and 3 with polymer coatings 5 and 7 respectively are bonded together to form a core-shell structure 11 that has a bond junction point 13, a metallic core 15 and a metal halide shell layer 17 over the metallic core. The metal halide shell layer generally is believed to have an average thickness of at least about 1 nanometer. Scanning electron micrographs (SEM) of exemplary bond junction point are described below in the examples. Silver nanowires in particular has been found can be fused together to improve the sheet resistance of the film formed from the $10^5$-$10^8$ or greater 11 Ω/sq range to the 10 to 100 Ω/sq range with less than 0.5% changes to the transparency. Nanowire network thicknesses can be used that provide overall good transparency of at least about 85% for networks with the reported low electrical resistance. The fusing can be achieved in less than a minute that impose little or no change or damage to the morphology of the metal nanowires. Thus, the process is well suited to efficient and relatively inexpensive commercial processing.

It was recently demonstrated by Magdassi and co-workers that thick films of silver nanoparticles (AgNPs) can be "sintered" at room temperature using various chemical agents for non-transparent patterned silver paste application. A process for the chemical fusing of metal nanoparticles is described in published PCT application WO 2010/109465 to Magdassi et al., entitled "Process for Sintering Nanoparticles at Low Temperatures," incorporated herein by reference. The nanoparticle low temperature sintering is further described in Grouchko et al., "Conductive Inks with a "Built-In" Mechanism That Enables Sintering at Room Temperature," ACS Nano Vol. 5 (4), pp. 3354-3359 (2011). The fusing of nanoparticles forms a sheet of metal, which can have a desired low electrical resistance, but the sheet of metal generally does not have desired amounts of transparency.

A vapor based process for the formation of a conductive film from silver nanowires is described in Liu et al., "Silver Nanowire-Based Transparent, Flexible and Conductive Thin Film," Nanoscale Research Letters, Vol. 6(75), 8 pages (January 2011) (hereinafter "the Liu article"). The films formed as described in the Liu article had reasonably low electrical resistance, but the transparency of the films was not satisfactory for many applications. The Liu article attributed their observations to the removal of surface oxidation from the silver nanowires. However, significant deterioration of the nanowire morphology has been observed in the micrographs shown in the Liu article. Liu article did not disclose conducting the reaction in solution phase with solution based sintering agents or using fluoride based sintering agents. Improved processing leads to significantly improved results for the fused metal nanowire networks described herein. It is not clear if sintering took place under the harsher conditions as noted in the Liu article. In particular, desired levels of fusing have been achieved with short time processing of the nanowires with the halide anions without degrading the level of optical transparency and with little deterioration of the nanowire morphology.

Based on the results described herein, the mechanism of the low temperature sintering process has been examined. While not wanting to be limited by theory, it is believed that the halide ions form a surface coating that facilitates metal ion migration. At locations where adjacent nanowires are close, the metal cores surprisingly fuse in a sintering process that presumably is driven by a free energy reduction from the sintering that is accessible due to the cation migration enabled by the formation of a metal-halide shell layer. The sintered metal forms electrical conduction pathways that results in dramatic decreases in the electrical conductivity. The sintering of the metal nanowires is observed to not measurably change the transparency to visible light. Thus, the chemical sintering of the metal nanowires into a conductive network can be accomplished without measurably diminishing the transparency so that the resulting films can be effectively used to form transparent conductive films.

For transparent electrode applications, higher-aspect ratio structures like wires or tubes are advantageous since the rod like shape can promote electrical conductivity primarily in-plane. The primarily in-plane conductivity in these rod-like structures allows for "open" areas and thin films which are useful for high light transmission and good 2D sheet conductivities. Nanowires (NWs) are particularly good candidates for transparent conductor applications. However due to their much larger size of about 10 s of nanometers in diameter and 10 s-100 s of microns in length, the surface area/volume ratio of nanowires is considerably smaller than NPs. Silver NWs for example typically do not melt until the temperatures of about 300-400° C. Silver nanowires are $10^4$-$10^5$ times larger in volume relative to nanoparticles and have much smaller ratio of surface area to volume and ratio of surface atoms to bulk atoms. The significant differences in physical size of nanowires relative to nanoparticles imply that the properties are likely to be correspondingly different.

The improved fused/sintered metal nanowire networks described herein can achieve simultaneously desirably low sheet resistance values while providing good optical transmission. In some embodiments, the fused metal nanowire networks can have optical transmission at 550 nm wavelength light of at least 85% while having a sheet resistance of no more than about 100 ohms/square. In additional or alternative embodiments, the fused metal nanowire networks can have optical transmission at 550 nm of at least 90% and a sheet resistance of no more than about 250 ohms/sq. Based on the ability to simultaneously achieve good optical transparency and low sheet resistance, the fused metal nanowire films can be used effectively as transparent electrodes for a range of applications. The loading of the nanowires to form the network can be selected to achieve desired properties.

To achieve the desirable properties of the fused metal nanowire networks, it was surprisingly discovered that short time exposure of silver nanowires to halide containing sintering agents could dramatically improve the conductivity of the nanowire networks or films. In general, the metal nanowire networks can be exposed to the sintering agent for times of no more than about 4 minutes to cause the desired fusing/sintering, and in some embodiments significantly less time can be used as described further below. The dramatic reduction in sheet resistance may partially be attributed to the removal of the insulating capping polymer polyvinylpyrrolidone (PVP) that is used to stabilize commercial silver nanowires, but is believed to be primarily related to the sintering of the nanowires. SEM studies of the treated silver nanowires indicated clearly the formation of fusing points between the nanowires that are in close proximity of each other as well as significantly reduced amount of detectable PVP polymer. In comparison, the SEM of the untreated silver nanowires clearly shows the presence of PVP polymer and the gap between the ends of the closely situated silver nanowires. Referring to FIG. 1C, a schematic diagram illustrating the process of the ends of three adjacent nanowires being fused together is shown. The fused nanowires form an elongated nanowire with two angles around the fused points. Elongated nanowires can further form a network of elongated nanowires as shown in FIG. 1D, with angles around the fused ends and arrows indicating the connection formation between the elongated nanowires to form the nanowire network.

To improve the performance of metal nanowire films generally, it is possible to increase the length of the nanowires and/or to correspondingly decrease the diameter of the nanowires. As the length of the nanowires increase, longer conduction pathways are present without the need for conduction across junctions between nanowires. As the diameter decreases, the overall film haze decreases, improving the optical properties of the film. With the use of sintering agents described herein, a film can be formed with particular initial nanowires having significantly greater electrical conductivity based on a particular loading with a corresponding optical transparency. Of course, with the availability of higher quality initial nanowires, such as having a longer average length and/or a smaller average diameter, a somewhat better un-sintered film may be formed in terms of electrical conductivity for a given loading or transparency, but the sintering process correspondingly further improves the electrical conductivity beyond an improvement based on the properties of the metal nanowires.

The fused silver nanowires disclosed herein have considerable differences from the sintered silver nanoparticles disclosed by Magdassi and the treated silver nanowires disclosed by Liu. Specifically, after the sintering process, the AgNPs of Magdassi aggregated together. The profiles of the individual AgNPs that existed prior to the sintering process have been destroyed considerably during the sintering process to form the aggregates. The word sintering indeed is a proper description of the melting and coalescing, and or coarsening of the silver nanoparticles of Magdassi. With regard to the treatment of silver nanowires proposed by Liu, although Liu intended to improve conductivity of the silver nanowires by removal of AgO, the prolonged HCl treatment disclosed by Liu caused observable thinning and shortening of the silver nanowires that seems to have degraded the properties of the resulting material.

In contrast to the processing approach described by Magdassi et al., the current processing approach is directed to the production of networks with a high level of optical transparency. The processing conditions are designed to achieve this objective, and the nanowire morphology is conducive to processing to obtain a desired degree of transparency. In particular, conductive films can have an optical transparency evaluated for convenience at 550 nm light wavelength of at least about 85%.

The processing of the metal nanowire networks described herein comprises the contact of a thin metal nanowire layer, i.e., a network, with a chemical fusing agent comprising a halide anion. The fusing agent can be delivered as a vapor or in solution. For example, acid halides are gaseous and can be delivered in a controlled amount from a gas reservoir or as vapor from a solution comprising the acid halide. Halide salts can be dissolved in solution with a polar solvent with a moderate concentration, and a quantity of the salt solution can be contacted with the nanowire network to fuse adjacent nanowires. Suitable solvents for forming a solution with the chemical fusing agent include, for example, alcohols, ketones, water, or a combination thereof. It has been discovered that superior properties of the fused network results from short processing times for the nanowire network with the fusing agent. The short processing times can be successful to achieve very low levels of sheet resistance while maintaining high optical transparency.

While the processing conditions are designed to produce good optical transparency, the metallic grid-like properties of the fused elongated silver nanowires dramatically increased conductivity with little change in transparency relative to the unfused networks. The drop in electrical resistance may be due to a drop in junction resistance between adjacent nanowires due to fusing of the adjacent nanowires. The treatment described herein may also have improved the connection between the other connecting points indicated by the arrows in FIG. 1D by removing oxidation layer of the nanowires, by removing the capping agent such as PVP of the nanowires, or by at least partially fusing these connection point together. Although removal of the PVP from the surface of silver nanowires have been observed in the examples below, fusing of the silver nanowires at points of contact can also be observed. The final transparent conductive material can best be described as a fused network of silver nanowires, as illustrated in FIG. 1D. The fused metal nanowire network structure has advantages over conventional metal grids described in FIG. 1A due to low cost fabrication methods and solution processability.

In summary, a highly conductive and transparent material was formed at room temperature by fusing the ends of silver nanowires to improve the conductivity without sacrifice the transparency. The resulting material appears to be a silver metallic grid like structure that is highly conductive. The examples below described using HCl as the fusing agent from the vapor phase, dilute solutions of HCl, NaCl, AgF, LiF, and NaF were also used to create the materials of comparable properties at room temperature. It is understood the metal nanowires could be treated multiple times to achieve the desired degree of fusing, with the same or different fusing agent during each treatment. Although silver nanowires were used to perform the fusing experiments, it is understood that other metal nanowires can be similarly fused together to form materials with improved conductivity.

The transparent conductive films that are formed from the fused metal nanowires are suitable for various applications. For example, some solar cells are designed to have an electrode along the light receiving surface, and a transparent conductive electrode may be desirable along this surface. Also, some display devices can be made with a transparent conductive electrode. In particular, touch inputs can be effectively formed with the transparent conductive films described herein, and the efficient patterning of the fused nanowire films can be used to form corresponding patterned touch sensors.

Figure 1F:
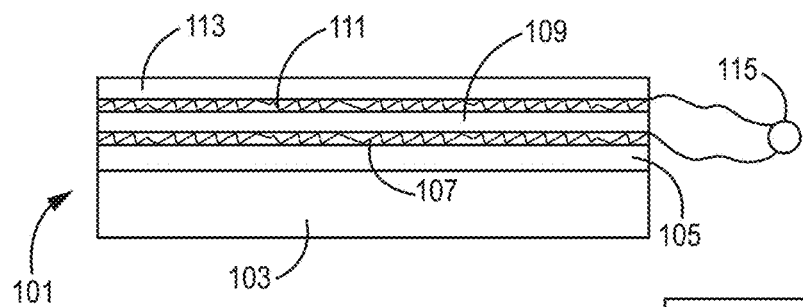
FIG. 1F is a schematic diagram of a capacitance based touch sensor.
Figure 1H:
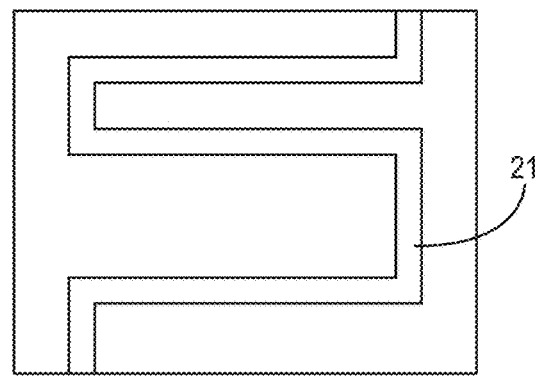
FIG. 1H is a schematic diagram of a AgNW film with one sintered pattern.
Figure 1G:
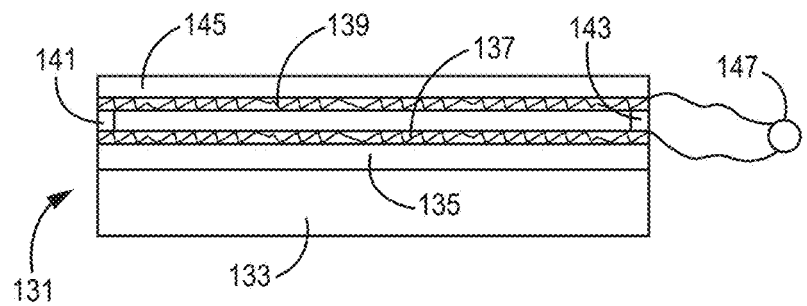
FIG. 1G is a schematic diagram of a resistance based touch sensor.

Touch inputs or sensors generally operate based on change of capacitance or a change of electrical resistance upon touching of the sensor surface. A common feature of the touch sensors generally is the presence of two transparent conductive electrode structures in a spaced apart configuration in a natural state, i.e., when not being touched or otherwise externally contacted. For sensors operating on capacitance, a dielectric layer is generally between the two electrode structures. Referring to FIG. 1F, a capacitance based touch sensor 101 comprises a display component 103, an optional bottom substrate 105, a first transparent conductive electrode structure 107, a dielectric layer 109, such as a polymer or glass sheet, a second transparent conductive electrode structure 111, optional top substrate 113, and measurement circuit 115 that measures capacitance changes associated with touching of the sensor. Referring to FIG. 1G, a resistance based touch sensor 131 comprises a display component 133, an optional lower substrate 135, a first transparent conductive electrode structure 137, a second transparent conductive electrode structure 139, support structures 141, 143 that support the spaced apart configuration of the electrode structures in their natural configuration, upper substrate 145 and resistance measuring circuit 147.

Display components 103, 133 can be LED based displays, LCD displays or other desired display components. Substrates 105, 113, 135, 145 can be transparent polymer sheets or other transparent sheets. Support structures can be formed from a dielectric material, and the sensor structures can comprise additional supports to provide a desired stable device. Measurement circuits 115 and 147 are known in the art, and some specific sensor embodiments are referenced below in the context of patterning. Transparent conductive electrodes 107, 111, 137 and 139 can be effectively formed using sintered metal networks, although in some embodiments the sintered metal networks form some electrode structures while other electrode structures in the device can comprise materials such as indium tin oxide, aluminum doped zinc oxide or the like. Fused metal networks can be effectively patterned as described herein, and it can be desirable for incorporate patterned films in one or more of the electrode structures to form the sensors such that the plurality of electrodes in a transparent conductive structure can be used to provide position information related to the touching process. Patterning is discussed further below.

Electrically Conductive Film Structure and Properties

The conductive films described herein generally comprise a substrate and a fused metal nanowire network deposited on the substrate. An optional polymer coating can be placed over the metal nanowire network to protect and stabilize the fused nanowire network. The parameters of the metal nanowires can be adjusted to achieve desirable properties for the fused network. For example, a higher loading of nanowires can result in a lower electrical resistance, but transparency can decrease with a higher nanowire loading. Through a balance of these parameters, desirable levels of electrical conductivity and optical transparency can be achieved. The nanowires in the improved networks are fused, as is observed in scanning electron micrographs. It is believed that the fusing of the nanowires results in the improved electrical conductivity while maintaining high levels of optical transparency. Having a network with fused nanowires should provide a stable electrically conductive structure over a reasonable lifetime of a corresponding product.

In general, the nanowires can be formed from a range of metals, such as silver, gold, indium, tin, iron, cobalt, platinum, palladium, nickel, cobalt, titanium, copper and alloys thereof are desirable due to high electrical conductivity. Silver in particular provides excellent electrical conductivity, and commercial silver nanowires are available. To have good transparency, it is desirable for the nanowires to have a small range of diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 5000 and in additional embodiments from about 100 to about 2000. A person of ordinary skill in the art will recognize that additional ranges of nanowire dimensions within the explicit ranges above are contemplated and are within the present disclosure.

Following sintering of the metal nanowires into a network, the individual nanowires are no longer present, although the physical properties of the nanowires used to form the network are directly reflected in the properties of the sintered network. While not wanting to be limited by theory, the low temperature sintering is believed to be caused by the halide ions forming a metal halide along the surface, which promotes metal ion migration resulting in the sintering of the metal cores of adjacent metal nanowires. The results in the example strongly suggest connection of the metal cores in the sintered materials. Processing can be performed at low temperatures, such as at room temperature.

The formation of the sintered network also results in a core shell structure. Results suggest that the shell is a metal halide that is located on top of the metal core. The details of the shell properties would be expected to depend on the specific processing conditions, but generally the shell has an average thickness from about 1 nm to about 10 nm. A person of ordinary skill in the art will recognize that additional ranges of shell thickness within the explicit range above are contemplated and are within the present disclosure. The metal halide shell may influence some properties of the fused metal network since the shell has intrinsically different optical properties from the metal core. In particular, metal wires reflect visible light, while metal halides generally have low reflectivity with respect to visible light. Furthermore, the metal halides have a lower reflectivity relative to the core metal. The optical properties of the shell may be advantageous in some contexts. Also, the metal halides are generally soluble in solvents that do not affect the metal core, so that it should be possible to selectively remove the metal halide shell without disturbing the fused metal network.

As noted above the amount of nanowires delivered onto the substrate can involve a balance of factors to achieve desired amounts of transparency and electrical conductivity. While thickness of the nanowire network can in principle be evaluated using scanning electron microscopy, the network can be relatively fragile, which can complicate the measurement. In general, the fused metal nanowire network would have an average thickness of no more than about 5 microns. However, the fused nanowire networks are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is presented as microgram or milligrams of nanowires for a square centimeter of substrate. In general, the nanowire networks can have a loading from about 0.1 microgram/cm$^2$ to about 5 milligrams (mg)/cm$^2$, in further embodiments from about 1 microgram/cm$^2$ to about 2 mg/cm$^2$, and in other embodiments from about 5 microgram g/cm$^2$ ($\mu$g/cm$^2$) to about 1 mg/cm$^2$. A person of ordinary skill in the art will recognize that additional ranges of thickness and loading within the explicit ranges above are contemplated and are within the present disclosure.

Electrical conductivity can be expressed as a sheet resistance, which is reported in units of ohms per square ($\Omega/\square$ or ohms/sq) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste. The fused metal nanowire networks can have a sheet resistance of no more than about 200 ohms/sq, in further embodiments no more than about 100 ohms/sq, and in other embodiments no more than about 60 ohms/sq. A person of ordinary skill in the art will recognize that additional ranges of sheet resistance within the explicit ranges above are contemplated and are within the present disclosure. In general, sheet resistance can be reduced by increasing the loading of nanowires, but an increased loading may not be desirable from other perspectives as described further below, and the loading is not as significant as achieving good fusing for improving the sheet resistance.

For applications as transparent conductive films, it is desirable for the fused metal nanowire networks to maintain good optical transparency. In general, optical transparency is inversely related to the loading, although processing of the network can also significantly affect the transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{film}$) While it is generally desirable to have good optical transparency across the visible spectrum, for convenience, optical transmission is reported herein at 550 nm wavelength of light. In some embodiments, the film formed by the fused network has a transmission at 550 nm of at least 80%, in further embodiments at least about 85% and in additional embodiments, at least about 90%. Transparency of the films on a transparent polymer substrate can be evaluated using the standard ASTM D1003 ("Standard Test Method for Haze and Luminous Transmittance of Transparent Plastics"), incorporated herein by reference. As noted above, the correlation of good optical transparency with low electrical resistance can be particularly desirable. In some embodiments with a sheet resistance from 20 ohm/sq to about 150 ohm/sq, the films can have an optical transmission at 550 nm of at least about 86%, in further embodiments at least about 88% and in other embodiments from about 89% to about 92%. In one embodiment, the film can have a sheet resistance of no more than about 75 ohm/sq and a transparency of at least about 85% at 550 nm. In another embodiment, the film can have a sheet resistance of no more than about 175 ohm/sq and a transparency of at least about 90% at 550 nm. A person or ordinary skill in the art will recognize that additional ranges of optical transmission within the explicit ranges above are contemplated and are within the present disclosure.

The sintered metal networks can also have low haze along with high transmission of visible light while having desirably low sheet resistance. Haze can be measured using a hazemeter based on ASTM D1003 referenced above. In some embodiments, the sintered network film can have a haze value of no more than about 0.5%, in further embodiments no more than about 0.45% and in additional embodiments no more than about 0.4%. A person of ordinary skill in the art will recognize that additional ranges of haze within the explicit ranges above are contemplated and are within the present disclosure.

As described in the Examples below, the processing approaches described herein result in the fusing of the metal nanowires. This fusing is believed to contribute to the enhanced electrical conductivity observed and to the improved transparency achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions. As described further below, short processing times are believed to contribute good fusing without degradation of the nanowire network.

In general, suitable substrates can be selected as desired based on the particular application. Substrate surfaces can comprise, for example, polymers, glass, inorganic semiconductor materials, inorganic dielectric materials, polymer glass laminates, composites thereof, or the like. Suitable polymers include, for example, polyethylene terephthalate (PET), polyacrylate, polyolefins, polyvinyl chloride, fluoropolymers, polyamides, polyimide, polysulfones, polysiloxanes, polyetheretherketones, polynorbornenes, polyester, polyvinyl alcohol, polyvinyl acetate, acrylonitrile-butadiene-styrene copolymer, polycarbonate, copolymers thereof, mixtures thereof and the like. Furthermore, the material can have a polymer overcoat placed on the fused metal nanowire network, and the overcoat polymers can comprise the polymers listed for the substrates above. Moreover, other layers can be added on top or in between the conductive film and substrate to reduce reflective losses and improve the overall transmission of the stack.

Processing of Nanowire Networks

The improved electrical conductivity and optical transparency has been found to be obtained with short time treatment of as deposited metal nanowire films with compounds comprising halogen anions. Desirable increases in electrical conductivity have been achieved with both vapor delivery of the fusing composition or with solution based delivery. The fusing achieves low electrical surface resistance while maintaining high levels of optical transmission.

The formation of the metal nanowire network comprises the formation of a dispersion of the metal nanowires in a suitable liquid and applying the dispersion as a coating onto the selected substrate surface. The concentration of the dispersion can be selected to obtain a good dispersion of the nanowires to provide for a desired degree of uniformity of the resulting coating. In some embodiments, the coating solution can comprise from about 0.1 wt % to about 5.0 wt % metal nanowires, and in further embodiments from about 0.25 wt % to about 2.5 wt % metal nanowires. A person of ordinary skill in the art will recognize that additional ranges of metal nanowire concentrations within the explicit ranges above are contemplated and are within the present disclosure. Similarly, the liquid for forming the dispersion can be selected to achieve good dispersion of the nanowires. For example, aqueous solvents, alcohols, such as ethanol or isopropyl alcohol, ketone based solvents, such as methyl ethyl ketone, organic coating solvents, such as toluene or hexane, or the like or mixtures thereof, are generally good dispersants for metal nanowires.

Any reasonable coating approach can be used, such as dip coating, spray coating, knife edge coating, bar coating, Meyer-rod coating, slot-die, gravure, spin coating or the like. After forming the coating with the dispersion, the nanowire network can be dried to remove the liquid. The dried film of metal nanowires can then be processed to achieve nanowire fusing.

A first approach to fusing can be performed with acid halide vapor, such as vapor from HCl, HBr, HI or mixtures thereof. HF can also be used, but HF may be corrosive to some substrate materials and is more toxic. Specifically, the dried coating can be exposed to the vapor of the acid halide for a brief period of time. The hydrogen halide compounds are gaseous and are soluble in water and other polar solvents such as alcohol. Generally, the vapor for fusing the metal nanowire film can be generated from a gas reservoir or from vapor given off by solutions of the hydrogen halide compounds. Acidic vapors can quickly be passed over the coating surfaces for example for about 10 s to form the nanowire network. In general, the coating containing the nanowires can be treated with acid vapor for no more than about 4 minutes, in further embodiments for from about 2 seconds to about 3.5 minutes and in other embodiments from about 5 seconds to about 3 minutes. A person of ordinary skill in the art will recognize that additional ranges of treatment times are contemplated and are within the present disclosure.

In further embodiments, the initial metal nanowires can be fused with a solution comprising halide anions. In particular, the solution comprising dissolved acid halide, dissolved metal halide salts or a combination thereof. Suitable compositions for forming the halide solutions include, for example, HCl, HBr, HF, $LiC_1$, NaF, NaCl, NaBr, NaI, KCl, $MgCl_2$, $CaCl_2$, $AlCl_3$, $NH_4C_1$, $NH_4F$, AgF, or a combination thereof. In particular NaCl, NaBr, and AgF provide particularly desirable fusing properties. In general, the halide fusing solution can be added to a previously formed coating comprising the metal nanowires to fuse the metal nanowires. Additionally or alternatively, the halide composition can be combined with the metal nanowire dispersion that is then deposited as a coating so that the metal nanowires and the fusing agent are simultaneously deposited. If the fusing agent is included with the metal nanowires in the metal nanowire dispersion, a separate fusing solution can also be delivered onto the metal nanowire coating to add an additional quantity of fusing agent.

The solutions for separate application of the fusing agent generally comprise halide ions at concentrations of at least about 0.01 mM, in some embodiments, from about 0.1 mM to about 10M, in further embodiments from about 0.1 M to about 5 M. The metal nanowires can be contacted with the halide solution using any reasonable approach such as dip coating, spraying, or the like. Alternatively or additionally, the halide salt or acid can be added directly to dispersant of nanowires in ranges from 0.01 mM to about 1M, in further embodiments from about 0.05 mM to about 50 mM and in additional embodiments from about 0.5 mM to about 10 mM, to form a nanowire and halide mixture. The mixture is then coated onto the substrate surface as described above to form a coating. The film formation process then results in the direct formation of the film with the fusing agent already present. Whether the solution comprising halide anions is delivered with the metal nanowire coating solution, with a separate fusing solution or both, the nanowires in the coating form fused nanowire networks upon solvent removal and the saturation of the halide ions. Formation of the nanowire network is complete when the solvent is completely removed from the coating to form a dry film, and while not wanting to be limited by theory, the fusing process is believed to be related to the concentration of the halide anions during the drying process. A person of ordinary skill in the art will recognize that additional ranges of concentration within the explicit ranges above are contemplated and are within the present disclosure.

The chemical reaction that results in the fusing of the metal nanowires into a network can be performed at room temperature, although it is not necessary to be performed at room temperature. Thus, the structure can be cooled or heated reasonably, generally without significantly changing the resulting structure. For embodiments in which the sintering agent is delivered in a solution, the solvent is evaporated as part of the process, and some heating can be desirable to speed the drying process, although the drying can be performed slowly by evaporation at room temperature or lower temperatures with or without reducing the pressure over the film to speed evaporation. The changing of the temperature involves the expenditure of energy, so it is generally desirable to not excessively heat or cool the materials even if the results of the processing are not greatly changed. The processing temperatures can be kept well below any temperatures at which any components, such as the substrate, melt or otherwise are adversely affected. In summary, the processing described herein generally can be performed at or near room temperature and other reasonable temperatures, and the processing temperatures can generally be selected to be low relative to melting temperatures of the materials involved. A selected temperature can be influenced by practical issues such as processing cost, processing equipment and processing time.

After completing the fusing process, the fused metal nanowire networks are ready for any additional further processing to form the final product. For example, the coating or film containing the metal nanowire networks may be rinsed to remove unreacted sintering agents, and/or may be encapsulated with a protective coating. Due to the high transparency with low electrical resistance, the fused nanowire networks are well suited for the formation of transparent conductive electrodes, transparent composites, which can be used for solar cells, displays, touch screens, solar windows, capacitive switches, and the like.

Patterning

The processing approaches described herein can be used for efficient patterning of films to form patterns of electrically conductive regions and less conductive regions with desirable optical transparency across the film. In particular, since the sintering process is performed chemically, the controlled delivery of the sintering agent to selected portions of a metal nanowire film can form a sintered metal network at the portions of a film contacted with the sintering agent, while the remaining portions of the metal nanowire film remain un-sintered. Of course, control of the sintering agent delivery does not have to be perfect for the patterning to be effective for appropriate applications.

Figure 1I:
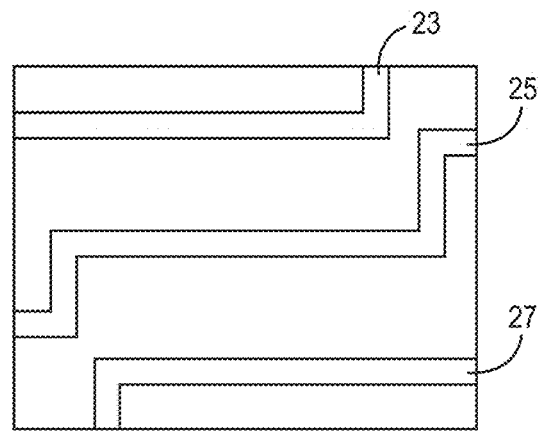
FIG. 1I is a schematic diagram of a AgNW film with three sintered areas.

The particular pattern of sintered conductive network along the substrate surface generally is guided by the desired product. The proportion of the surface comprising the electrically conductive sintered network can generally be selected based on the selected design. In some embodiments, the sintered network comprises from about 1 percent to about 99 percent of the surface, in further embodiments from about 5 percent to about 85 percent and in additional embodiment from about 10 percent to about 70 percent of the substrate surface. A person of ordinary skill in the art will recognize that additional ranges of surface coverage within the explicit ranges above are contemplated and are within the present disclosure. The sintered network along the surface can form a conductive pattern with a single pathway 21, as shown in FIG. 1H or with a plurality of electrically conductive pathways 23, 25, and 27, as shown in FIG. 1I. As shown in FIG. 1I, the sintered area forms three distinct electrically conductive regions 23, 25, and 27. Although a single connected conductive region and three independently connected conductive regions have been illustrated in the figures, it is understood that patterns with two, four or more than 4 conductive independent conductive pathways or regions can be formed as desired. Similarly, the shapes of the particular conductive regions can be selected as desired.

The difference between the electrical conductivity of the sintered network regions of the surface and the un-sintered nanowire regions can provide desired functionality. In general, the variation in the electrical conductivity between the sintered regions and the un-sintered regions can be very large, as described in the examples, although less large contrasts can still be effective. In general, the un-sintered metal nanowire regions have a sheet resistance that is at least about 5 times the sheet resistance of the sintered metal network, in further embodiments at least about 100 times, in additional embodiments at least about 1000 times, and in other embodiments at least about 1,000,000 or greater times the sheet resistance of the sintered metal network. It can be difficult to measure extremely high resistances due to cut offs in the measurement scale. A person of ordinary skill in the art will recognize that additional ranges within the explicit ranges above are contemplated and are within the present disclosure. The optical transparency to visible light can be approximately the same through the sintered metal network and through the un-fused metal nanowire film, although other optical properties of the sintered network regions of the film can be different from the un-sintered regions due to the core-shell structure of the sintered networks.

The patterning of sintered and un-sintered regions of the metal nanowire film can be driven by the selective delivery of the sintering agent. Thus, the metal nanowire film can be first delivered to a surface. In general, the metal nanowire film can be delivered to be relatively uniform across the surface or some appropriate portion thereof. Of course, a fraction of the surface can remain uncoated at all with nanowire film, and references to patterning refer to the portions of the surface with the nanowire film, i.e. sintered and un-sintered portions of the film.

With the use of a vapor sintering agent, such as HCl vapor, a portion of the substrate selected to remain un-sintered, is masked or otherwise blocked from contact with the vapors. Then, the unmasked portions of the metal nanowire film are contacted with the sintering vapor to form the sintered metal network. The mask or other cover can be removed following the completion of the contact with the sintering agent.

If a liquid solution comprising the sintering agent is applied to the metal nanowire film, the sintering solution can be delivered to the selected portions of the film to perform the sintering. While a well sealed mask can be used to prevent contacting of the liquid sintering agent with selected portions of the film, it can be desirable to print the liquid sintering agent along the desired portion of the film using ink jet printing, screen printing or other appropriate printing process. The properties of the liquid sintering agent can be adjusted to be appropriate for the particular printing approach. A small volume of liquid sintering agent can be delivered to provide the appropriate sintering. The liquid and/or the printing process can be controlled to limit the spreading of the sintering liquid or to have spreading controlled to provide sintering over a selected region.

The efficient patterning of the conductive transparent film can be very effective for certain display and or touch sensor applications. In particular, a touch sensor may desirably have patterns of electrically conductive regions to provide for a corresponding pattern of touch sensors, and the transparency provides for the visualization of a display or the like under the pattern as shown in FIGS. 1F and 1G above. The use of patterned transparent conductive electrodes for the formation of patterned touch sensors is described, for example, in U.S. Pat. No. 8,031,180 to Miyamoto et al., entitled "Touch Sensor, Display With Touch Sensor, and Method for Generating Position Data," and published U.S. patent application 2012/0073947 to Sakata et al., entitled "Narrow Frame Touch Input Sheet, Manufacturing Method of Same, and Conductive Sheet Used in Narrow Frame Touch Input Sheet," both of which are incorporated herein by reference.

EXAMPLES

Silver nanowires with different sizes purchased from either ACS Materials or Seashell Technology, LLC (CA, USA) were used in the following examples. The properties of the silver nanowires were an average diameter of 60 nm and an average length of 10 microns or an average diameter of 115 nm and an average length of 30 microns.

Example 1—Fabrication of Transparent Conductive Material Using HCl Vapor Treatment This example demonstrates the ability to use a vapor based fusing agent to chemically drive the fusing of silver nanowires to dramatically improve the electrical conductivity.

Commercially available silver nanowires (AgNWs) were dispersed in alcohols e.g. ethanol or isopropanol to form an AgNWs dispersion. The AgNWs dispersions were typically in the 0.1-1.0% wt range. The dispersion was then deposited on glass or polyethylene terephthalate (PET) surfaces as an AgNWs film using a spray coating or a hand-drawn rod approach. The AgNWs film was then exposed briefly to HCl vapour as a fusing agent. Specifically, the AgNWs film was exposed to HCl vapour from a concentrated HCl solution at room temperature for about 10 seconds. AgNWs from two different vendors were used. The sheet resistance and transparency of the AgNWs film before and after the treatment with HCl vapour were measured and recorded. The data of AgNWs from the first vendor is listed in Table 2 and the date of AgNWs from the second vender is listed in Table 3 below.

TABLE 2

| Sample No. | Sheet Resistance Before HCl (ohm/sq) | Sheet Resistance After HCl (ohm/sq) |
| --- | --- | --- |
| 1 | 10000000 | 660 |
| 2 | 83000 | 60 |
| 3 | 10000000 | 1909 |
| 4 | 10000000 | 451 |
| 5 | 800000 | 113.4 |
| 6 | 695000 | 30 |
| 7 | 10000000 | 62 |
| 8 | 399000 | 562 |
| 9 | 14,200 | 53.4 |
| 10 | 10000000 | 283 |
| 11 | 10000000 | 1260 |
| 12 | 10000000 | 364 |
| 13 | 10000000 | 6700 |
| 14 | 10000000 | 1,460 |
| 15 | 10000000 | 70.5 |
| 16 | 10000000 | 2280 |
| 17 | 10000000 | 155 |
| 18 | 10000000 | 1654 |
| 19 | 10000000 | 926 |

TABLE 3

| Sample | Sheet Resistance Before HCl (ohm/sq) | Sheet Resistance After HCl (ohm/sq) |
| --- | --- | --- |
| 1 | 13180 | 253 |
| 2 | 6200000 | 244 |
| 3 | 6030 | 115 |
| 4 | 32240 | 43.6 |
| 5 | 4300000 | 68.3 |
| 6 | 10000000 | 1060 |
| 7 | 10000000 | 47.5 |
| 8 | 3790 | 61.7 |
| 9 | 4690 | 42.4 |
| 10 | 404 | 37.5 |

Figure 2:
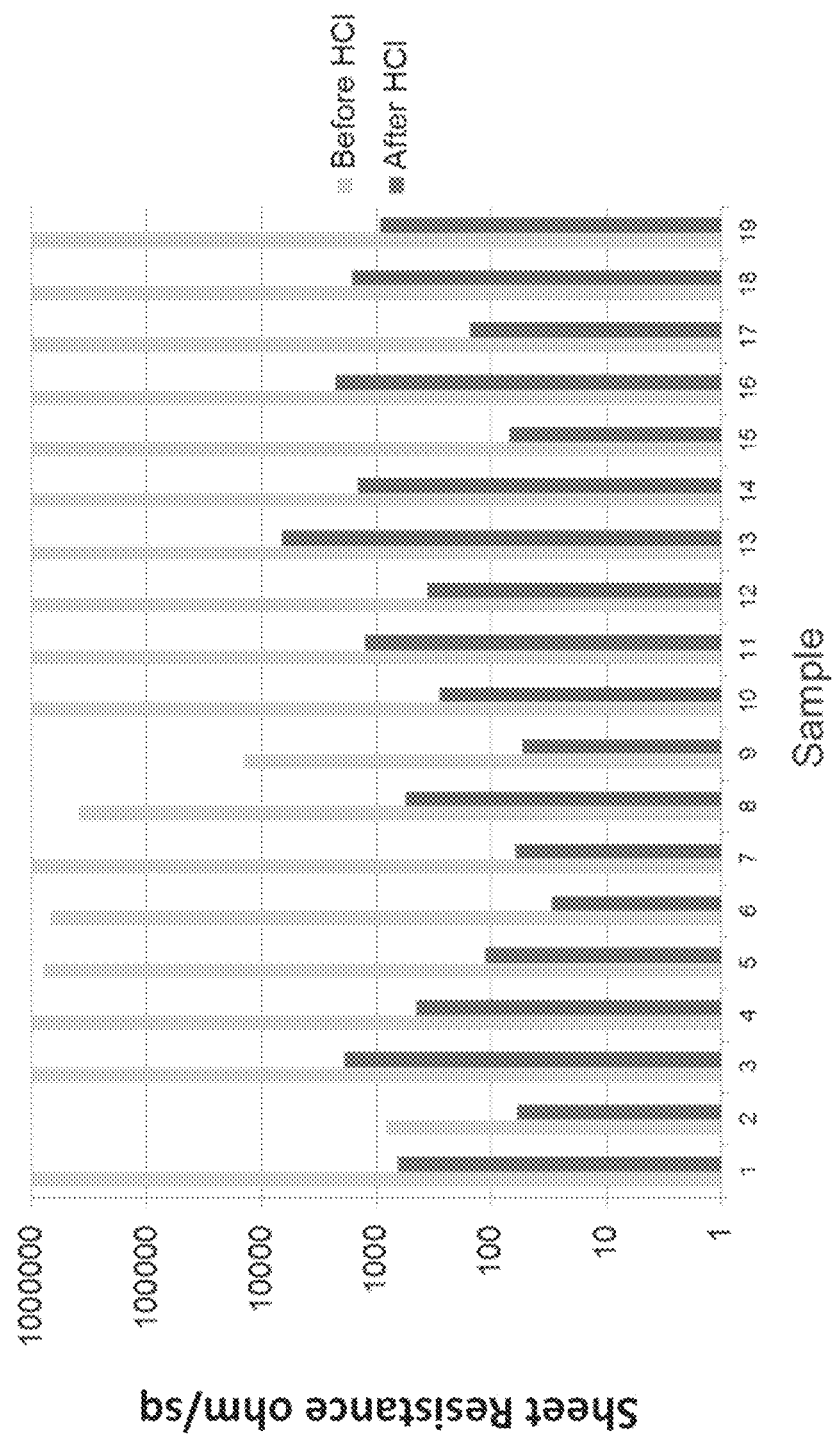
FIG. 2 is a plot of sheet resistance of the samples from the first vendor tested before and after the HCl vapor treatment having a transparency at 550 nm greater than 75%.
Figure 3:
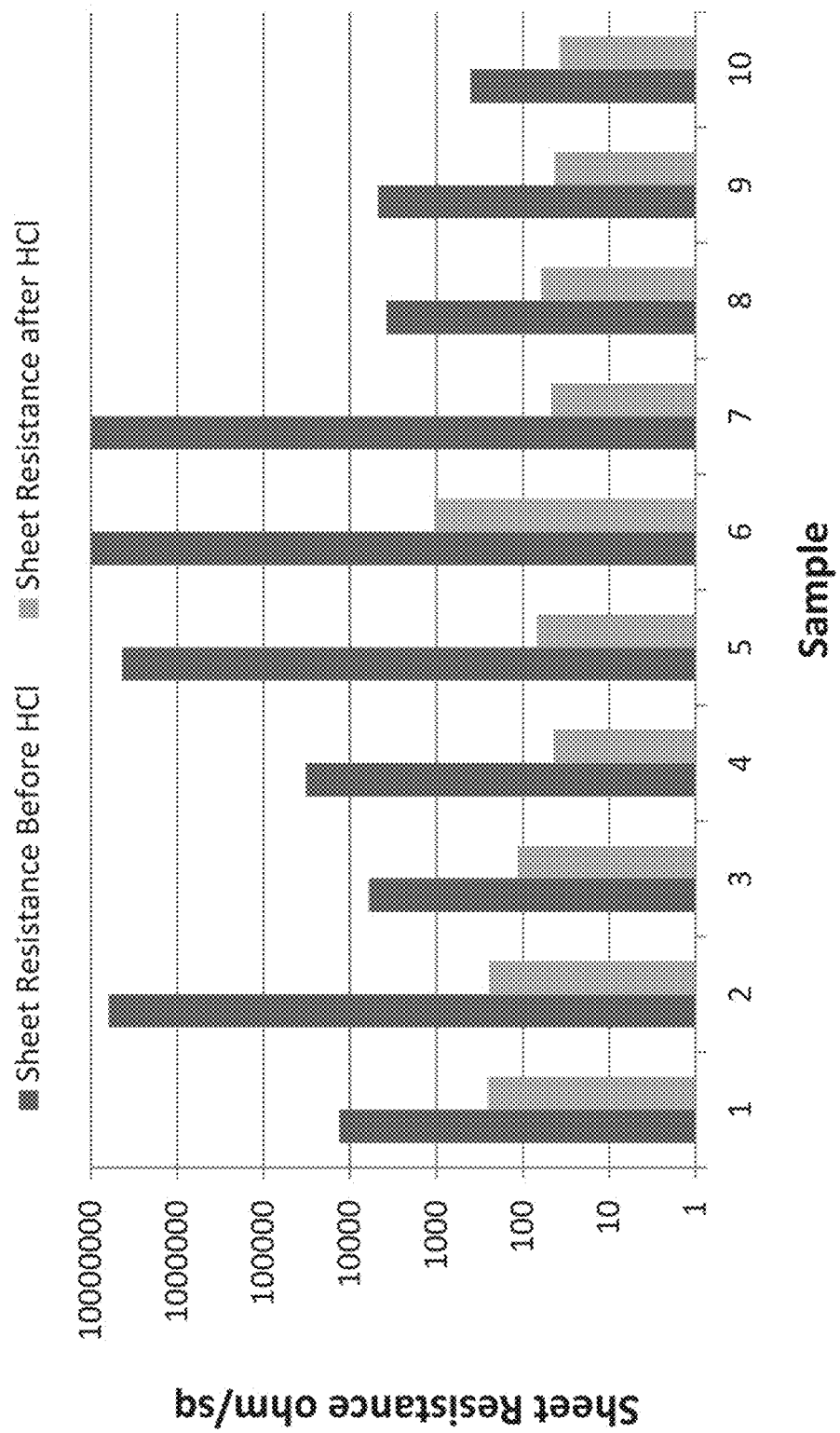
FIG. 3 is a plot of sheet resistance of the samples from the second vendor tested before and after the HCl vapor treatment showing dramatic improvement in conductivity.

Because the large numerical range involved, the data were plotted in logarithmic format in figures so the small numbers can also be visualized graphically. The data from Table 2 was plotted in FIG. 2 and data from Table 3 was plotted in FIG. 3. The films corresponding to the electrical conductivity results in Tables 2 and 3 had moderate loadings with corresponding reasonable transparency to visible light. As shown in FIG. 2, the conductivity of the AgNWs film improved over 4 to 5 orders of magnitude after the HCl vapour treatment. Additionally, these AgNWs films showed transparencies at 550 nm greater than 75%, which decreased less than 0.5% after HCl vapour treatment. Similarly, in FIG.

3, dramatic improvement in conductivity was also observed. The properties of the nanowire networks after fusing were relatively independent of the properties of the initial nanowires for these two sets of nanowires, but the longer nanowires exhibited overall a reduced electrical resistance prior to fusing.

Figure 4:
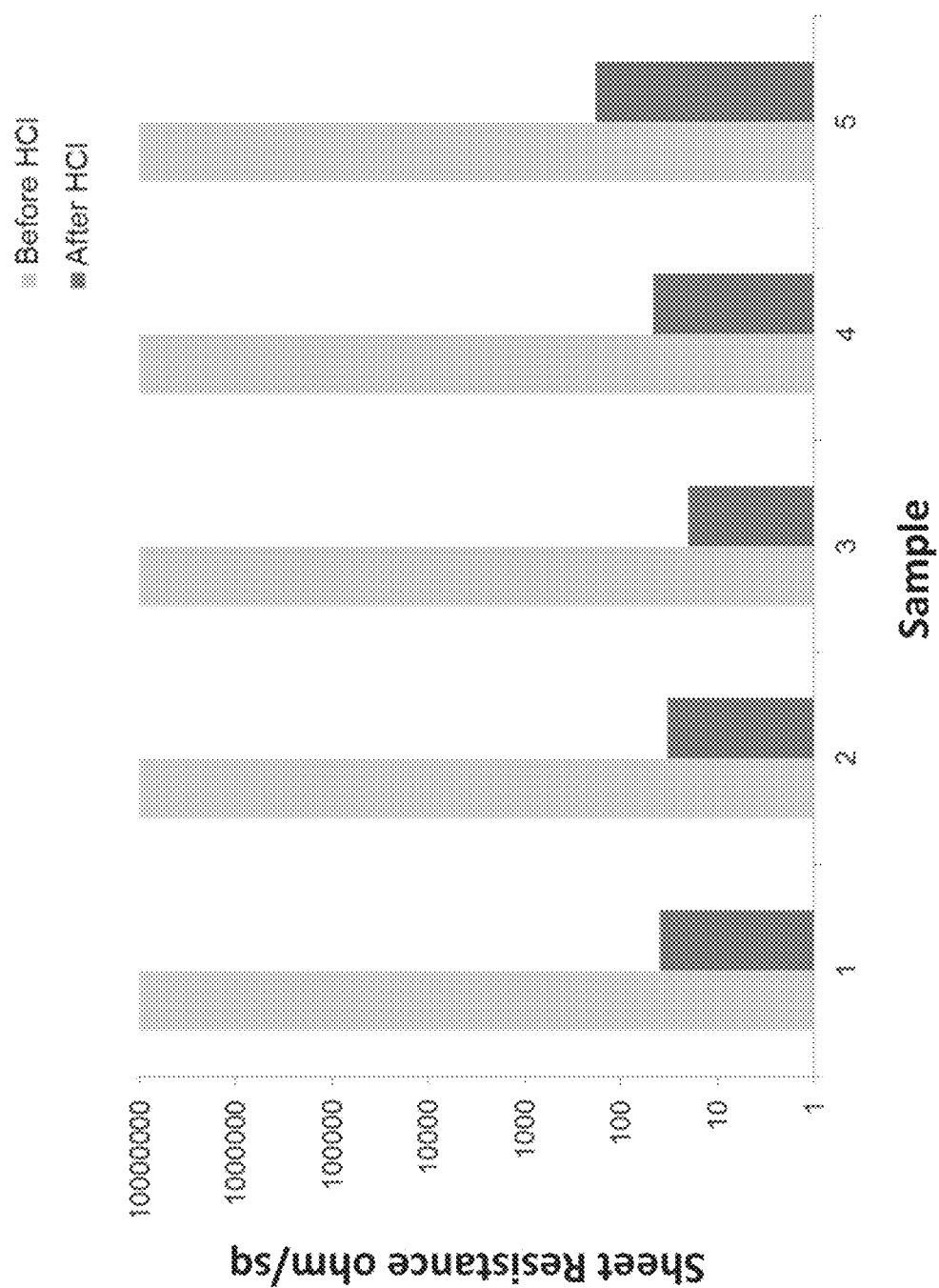
FIG. 4 is a plot of sheet resistance of the samples tested before and after the HCl vapor treatment having a transparency at 550 nm greater than 85%.

Additional AgNWs films were formed that has transparencies at 550 nm greater than 85%. These films were also treated with HCl vapor for about 10 seconds, and the sheet resistances of the AgNWs films before and after the HCl vapour treatment were measured. The results for one set of samples are presented in Table 4, and results for another set of samples are plotted in FIG. 4. Samples 2, 3, and 4 in FIG. 4 in particular have sheet conductivity between 30 to 50 ohm/sq while maintaining the transparency of the films above 85%. The results shown in Table 4 clearly demonstrate the ability to obtain transmission with 550 nm light greater than 90% with sheet resistance values less than 50 ohm/sq.

TABLE 4

| Resistance Prior to Sintering | Resistance After Sintering | Transmission at 550 nm (Conductive Film Only) |
|---|---|---|
| 801 | 45 | 89.1 |
| >$10^6$ | 40 | 88.9 |
| >$10^6$ | 33 | 88.1 |
| >$10^6$ | 20 | 87.8 |
| >$10^6$ | 46 | 90.6 |
| >$10^6$ | 182 | 92.4 |
| >$10^6$ | 129 | 91.6 |
| >$10^6$ | 85 | 89.2 |

Example 2—Observation of the Fusing of the Silver Nanowires

This example provides evidence of nanowire physical fusing as a result of contact with chemical fusing agents.

Figure 5:
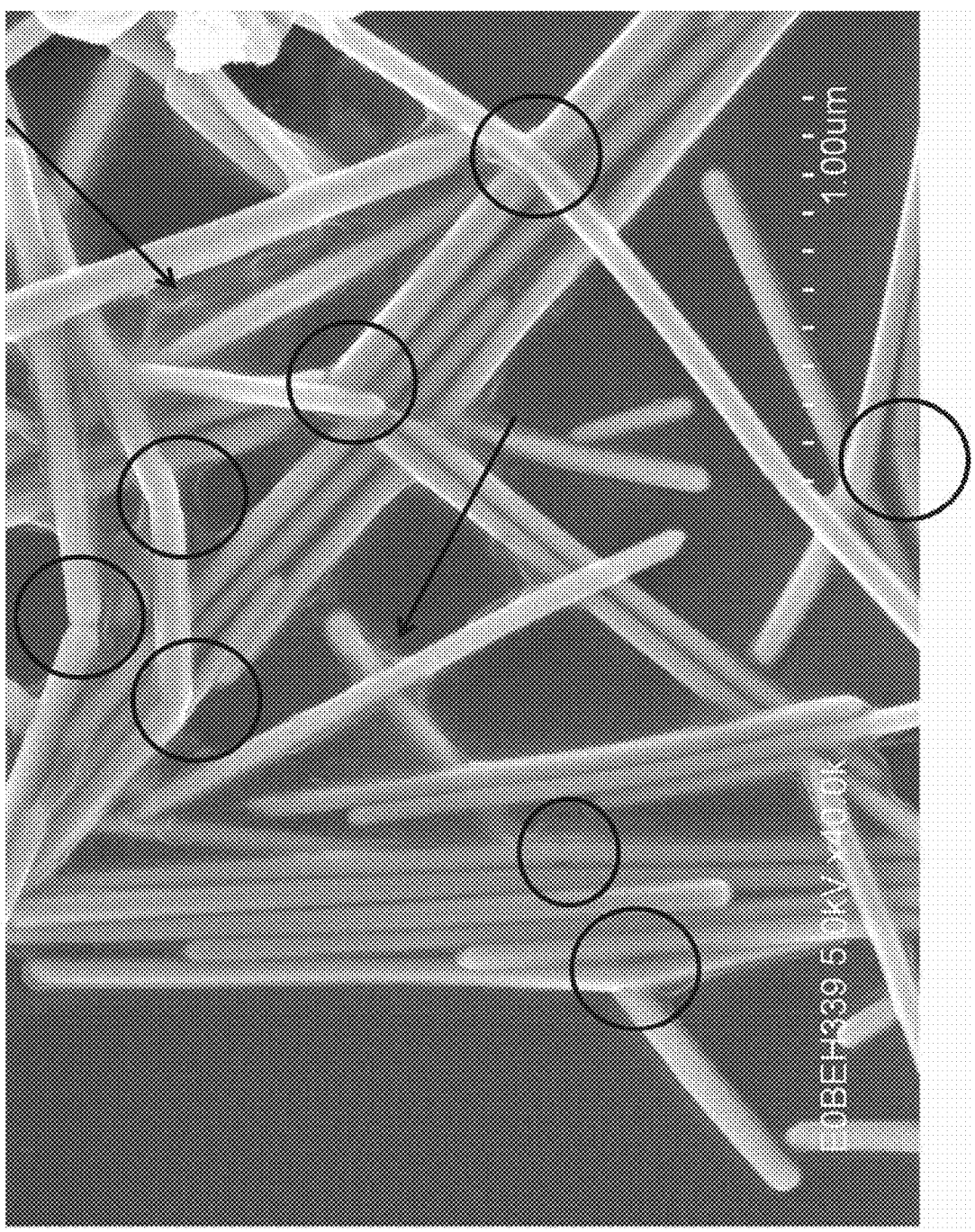
FIG. 5 is a scanning electron micrograph (SEM) of silver nanowires before any treatment.
Figure 6:
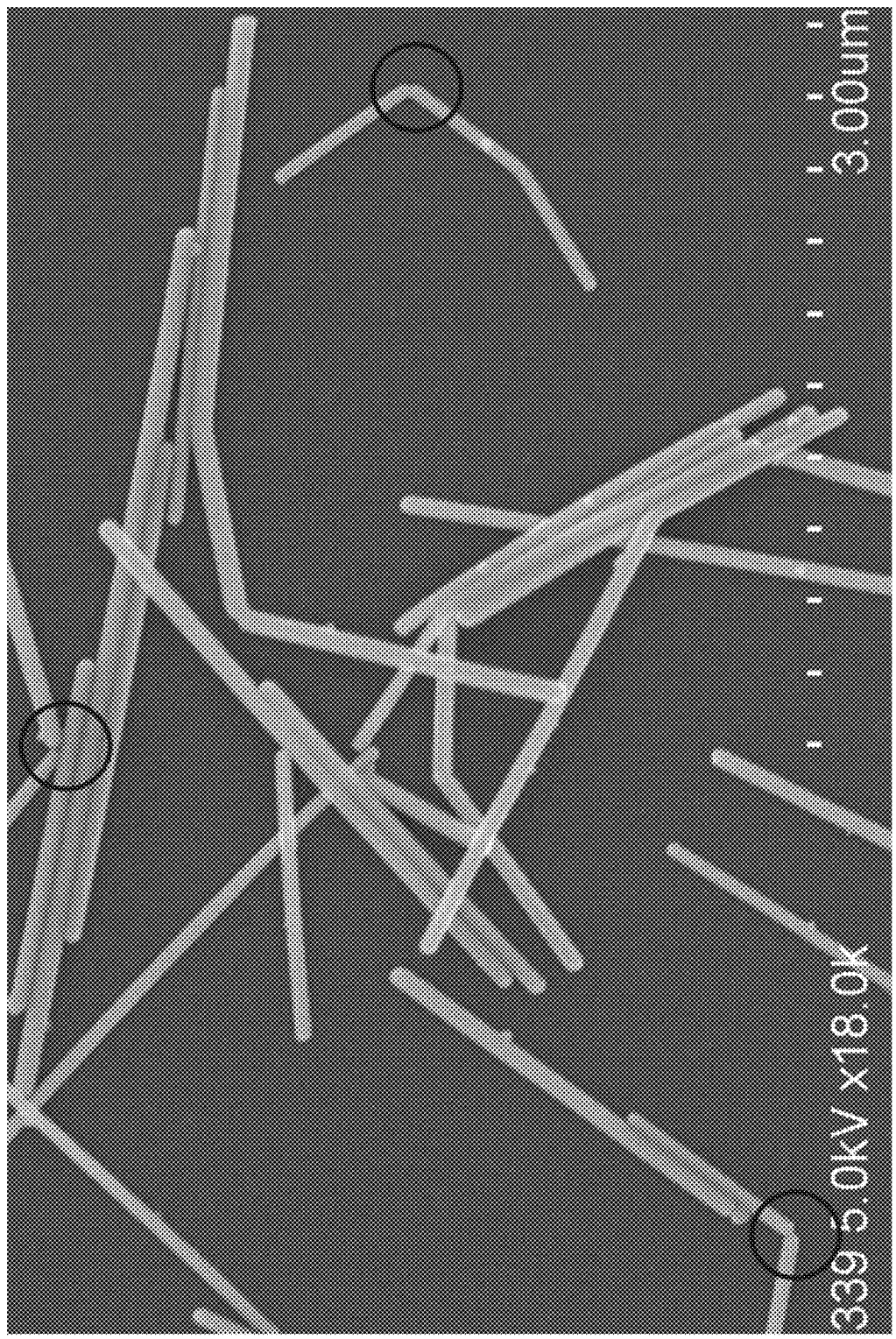
FIG. 6 is a SEM micrograph of silver nanowires after heat treatment.
Figure 7:
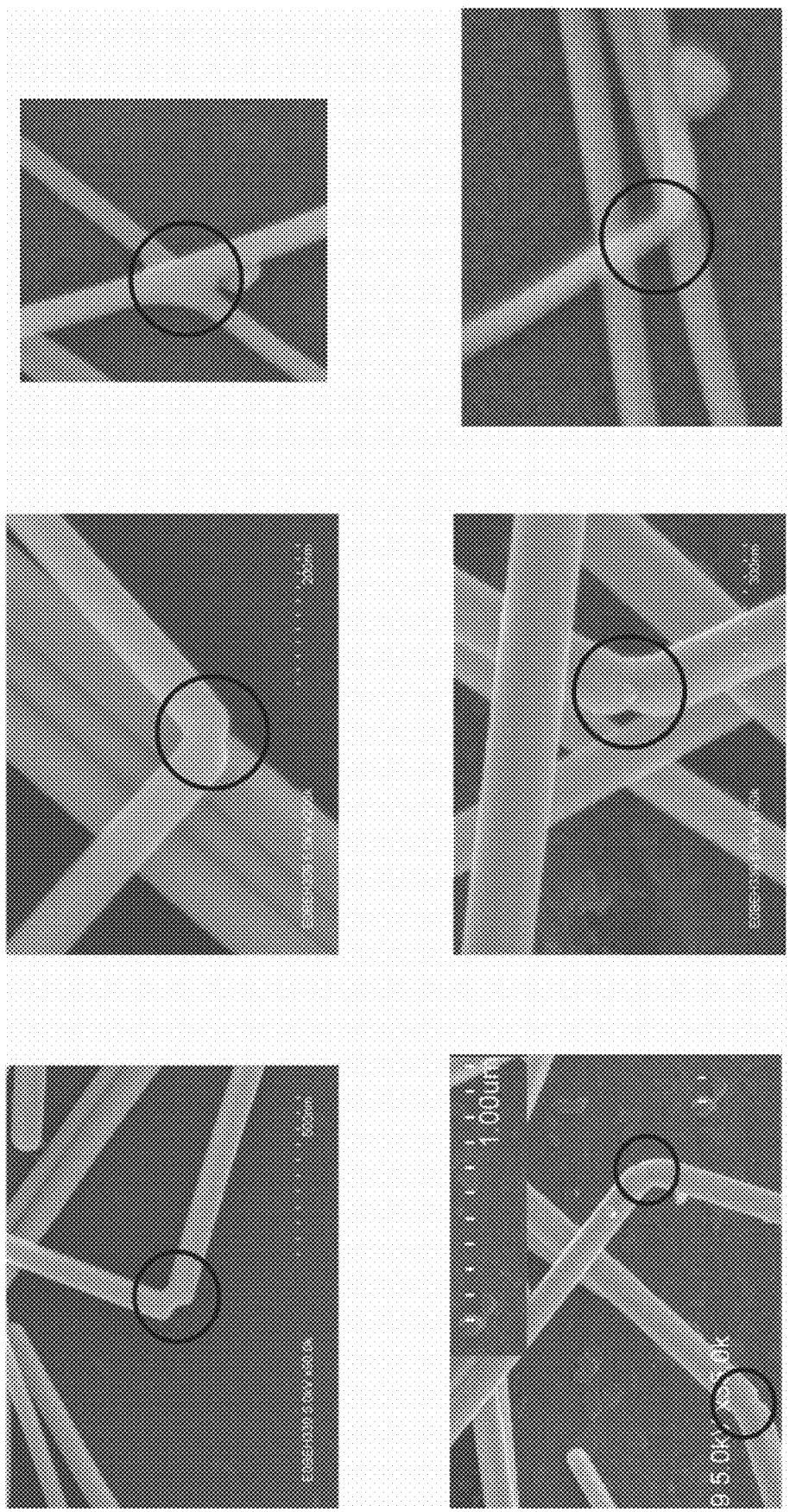
FIG. 7 shows six SEM micrographs of fused silver nanowires after HCl vapor treatment.

The dramatic conductivity improvement observed in Example 1 can be attributed to the fusing of some of the silver nanowires with adjacent silver nanowires. Scanning electron micrographs (SEM) of the silver nanowires before treatment were obtained and are shown in FIG. 5. As shown in FIG. 5, some of the ends (indicated by the circles) of the silver nanowires appear to touch each other, but the ends apparently do not appear to be fused together. Additionally, polyvinylpyrrolidone (PVP) coating (indicated by arrows in the figure) can be seen to be present around the rods. As a comparison, the silver nanowires shown in FIG. 5 were heated at 100° C. for 10 minutes. No appreciable conductivity change has been observed after the heating. SEM micrographs of the silver nanowires after the heat treatment were obtained and are shown in FIG. 6. Heating does not appear to have fused the ends as shown in FIG. 6, some of the ends (indicated by the circles) of the silver nanowires do not appear to be fused together. Scanning electron micrographs were obtained for nanowire networks after the HCl vapor treatment and are shown in FIG. 7. SEM of the silver nanowires in FIG. 7 after the HCl treatment showed the ends (indicated by the circles) of the silver nanowires have been fused together, and other locations of contact between adjacent nanowires are believed to similarly fuse to form fused silver nanowire networks.

Example 3—Fabrication of Transparent Conductive Material Using Halide Solution Treatment This example demonstrated the reduction in electrical resistance through the treatment of the networks with solutions containing halide anions.

Figure 8:
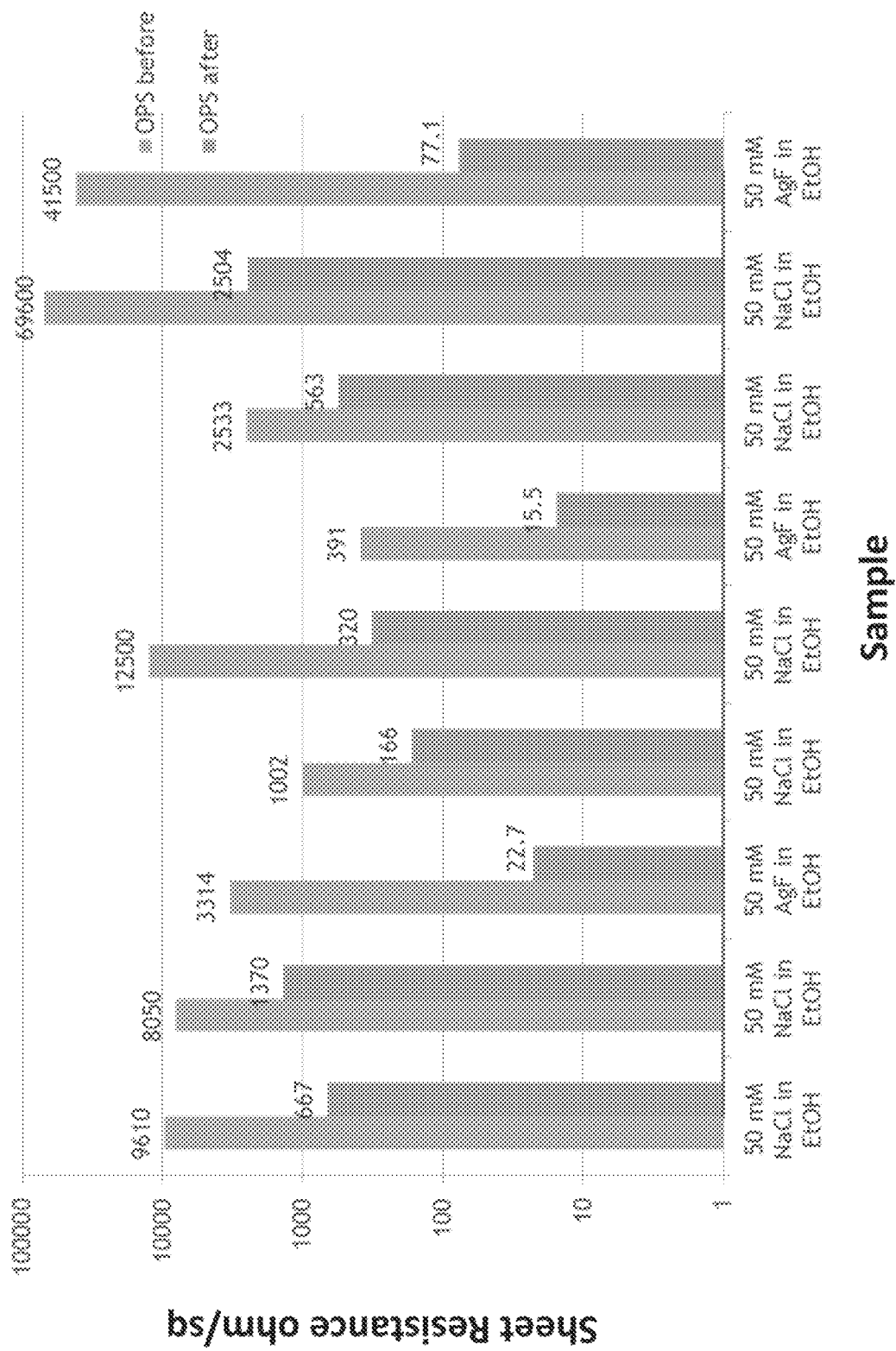
FIG. 8 is a plot of sheet resistance of samples treated with 5 mM NaCl in ethanol and AgF in ethanol solutions.

Specifically, 50 mM solutions of AgF or NaCl in ethanol were used to treat the AgNWs films. When the fusing agent solution is used, the AgNWs film was submerged or covered with the fusing agent solution for about 10 to about 30 seconds, or dilute solutions of AgF or NaCl were spray coated (from ethanol) onto the AgNW. The AgNWs were then allowed to dry. The sheet resistance of the AgNWs film before and after the treatment with the halide solutions were measured and the results are shown in FIG. 8. As shown in FIG. 8 dramatic conductivity improvement is also observed of the AgNWs films treated with halide solutions, with AgF treated samples showing even more pronounced improvement compared to the NaCl treated samples. In general, the transmission of light changed marginally (<5%) and less than 1% if residual salt solution was removed. Residual salt was removed by spraying gently with water or ethanol.

Dramatic improvements in conductivity with negligible changes in transparency are important for transparent conductor applications. The conductivity of transparent conductors is often improved by adding more conducting materials, for example more AgNWs, but the transmission can dramatically decrease. The methods and processes described herein provide a convenient and cost effective approach to dramatically improve the conductivity of nanowire materials without sacrificing transparency or adding additional nanowires.

Example 4—Low Haze Transparent Conductive Material Using HCl Vapor

This example demonstrates the ability to use HCl Vapor to bond silver nanowires to form core-shell structures that have dramatically improved electrical conductivity while having low haze and maintaining transparency.

Figure 9:
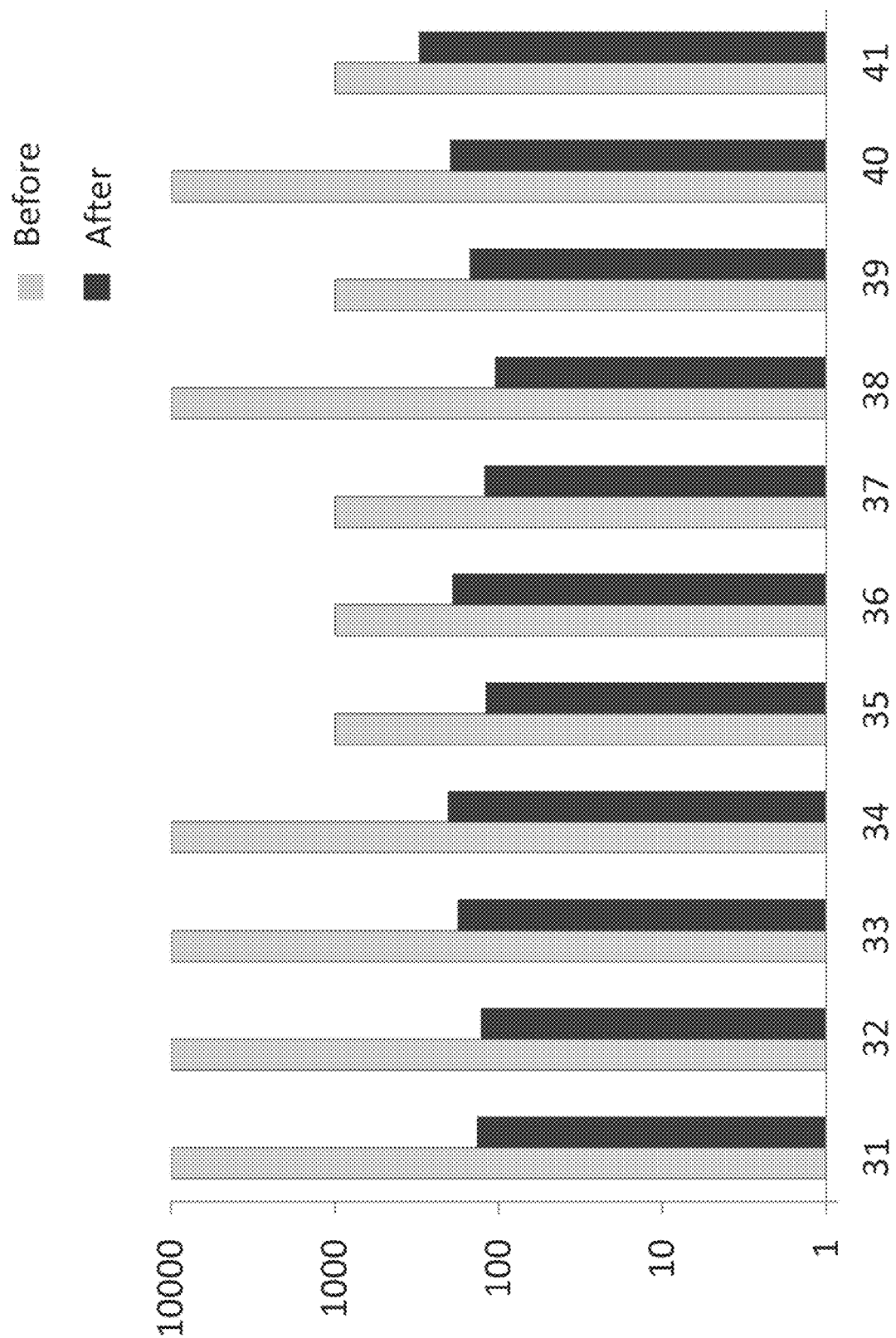
FIG. 9 is plot of conductivity of the film samples before and after the sintering from Example 4 plotted in logarithmic scale showing dramatic improvement in conductivity after the treatment with the vapor sintering agent.

Commercially available silver nanowires (AgNWs) roughly 35 nm in diameter and 15-20 microns in length were dispersed in alcohols e.g. ethanol or isopropanol to form an AgNWs dispersion. The AgNWs dispersions have typically about 0.2 wt % concentration. The dispersion was then cast using a draw down Meyer Rod (rod 10) onto polyethylene terephthalate (PET) surfaces as AgNWs film samples 31 to 41 The AgNWs film samples were then exposed to HCl vapour for about 5 seconds to sinter the AgNWs together to form a core-shell formulation. Sheet conductivity of the AgNWs film samples before and after the sintering process was measured using an R-Check hand-held 4 point probe or by making a perfect square and painting silver paste. The total transmission (TT) and haze of the AgNWs film samples were measured using a BYK Gardner Haze Meter. The BYK instrument is designed to evaluate optical properties based on ASTM D 1003 standard. The data of AgNWs samples 31-41 are listed in Table 5 below. Percentage of transmission (% T) and haze were obtained from the conductive film only, i.e. the optical properties of the bare polymer substrate are subtracted away. The conductivities of the film samples before and after the sintering were plotted in FIG. 9 with the conductivity in logarithmic scale. As shown in FIG. 9, dramatic improvement in conductivity was observed after the treatment with the vapor sintering agent.

TABLE 5

| Sample | Pre-sintering | | Post Sintering | | |
|---|---|---|---|---|---|
|  | $R_s$ Ω/□ | % T | $R_s$ Ω/□ | % T | Haze |
| 31 | >$10^4$ | 99.1 | 135 | 99.0 | 0.65 |
| 32 | >$10^4$ | 99.1 | 128 | 99.1 | 0.61 |
| 33 | >$10^4$ | 99.0 | 178 | 98.9 | 0.10 |
| 34 | >$10^4$ | 98.2 | 204 | 98.1 | 0.23 |
| 35 | $10^3$ | 98.9 | 120 | 98.7 | 0.43 |
| 36 | $10^3$ | 98.9 | 191 | 98.9 | 0.46 |
| 37 | $10^3$ | 99.0 | 122 | 99.0 | 0.34 |
| 38 | >$10^4$ | 99.4 | 105 | 99.1 | 0.47 |
| 39 | >$10^3$ | 98.1 | 150 | 98.1 | 0.92 |
| 40 | >$10^4$ | 98.5 | 198 | 98.5 | 0.53 |
| 41 | $10^3$ | 98.6 | 306 | 98.6 | 0.52 |

Example 5—Transparent Conductive Material Using Fluoride Salt Separately Added as Sintering Solution This example demonstrates the ability to use a fluoride salt as a sintering agent to bond silver nanowires to form core-shell structures that have dramatically improved electrical conductivity while maintaining high transparency.

Commercially available silver nanowires (AgNWs) roughly 40 nm in diameter and 15-20 microns in length were dispersed in alcohols e.g. ethanol or isopropanol to form an AgNWs dispersion. The AgNWs dispersions have typically about 0.2 wt % concentration. The dispersion was then cast using a draw down Meyer Rod onto polyethylene terephthalate (PET) surfaces as AgNWs film samples 42 and 43. Each sample 42 and 43 were formed with triplicates. The AgNWs film samples 42 and 43 were then submerged into LiF or NaF solutions respectively for about 5 seconds to carry out the sintering process. The concentrations of the LiF or NaF solutions were about 1.0 mM. The submerged films were then dried with nitrogen to form the core-shell metal network. The conductivity of the film samples 42 and 43 before and after the sintering was plotted in FIGS. 10A and 10B respectively with the conductivity in logarithmic scale. The films formed have high transparency generally greater than about 85 percent.

Example 6—Transparent Conductive Material Using Mixture of AgNWs and Fluoride Salt This example demonstrates the mixture of fluoride salt and silver nanowires form core-shell structures that have dramatically improved electrical conductivity while having low haze and maintaining transparency.

Commercially available silver nanowires (AgNWs) roughly 40 nm in average diameter and 15-20 microns in average length were dispersed in alcohols e.g. ethanol or isopropanol to form an AgNWs stock dispersion. AgF and $AlF_3$ solutions with concentration of about 1.0 to 5.0 mM were created in alcohols such as isopropanol (IPA). The AgNWs stock dispersion was then added into the AgF and $AlF_3$ solutions to form mixture solutions 44 and 45 respectively. The concentration of AgNWs in these mixture solutions was about 0.2 wt %. The mixture solutions 44 and 45 were then cast using a draw down Meyer Rod (rod 10) onto polyethylene terephthalate (PET) surfaces as AgNWs film samples 44 and 45. Each sample 44 and 45 were formed with triplicates. The film samples 44 and 45 were then dried using a heat gun for about 5 seconds to produce the core-shell formulation. Same procedure was carried out for each triplicate of samples 44 and 45. The conductivity of the film samples 44 and 45 before and after the sintering was plotted in FIGS. 11A and 11B respectively with the conductivity in logarithmic scale. The films had high transparency, generally greater than about 85% and in some samples greater than about 89%.

Example 7—Analysis of Sintered Materials

Sintered materials from examples above have been analyzed and evaluated to better understand the core-shell structure and sintering.

Figure 12B:
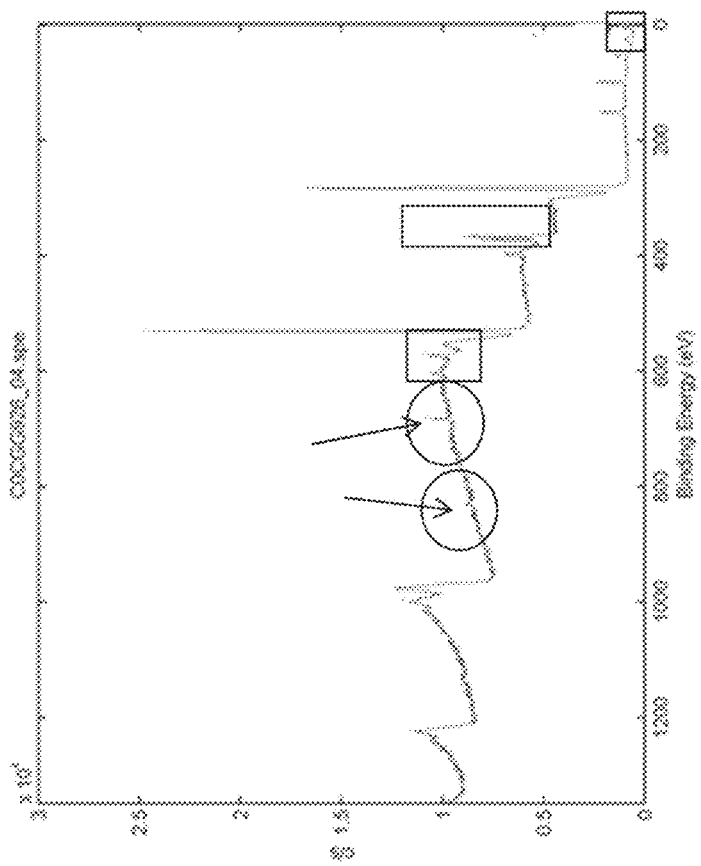
FIGS. 12A and 12B are XPS (X-Ray Photoelectron Spectroscopy) of sample 42 before and after the sintering respectively.
Figure 12A:
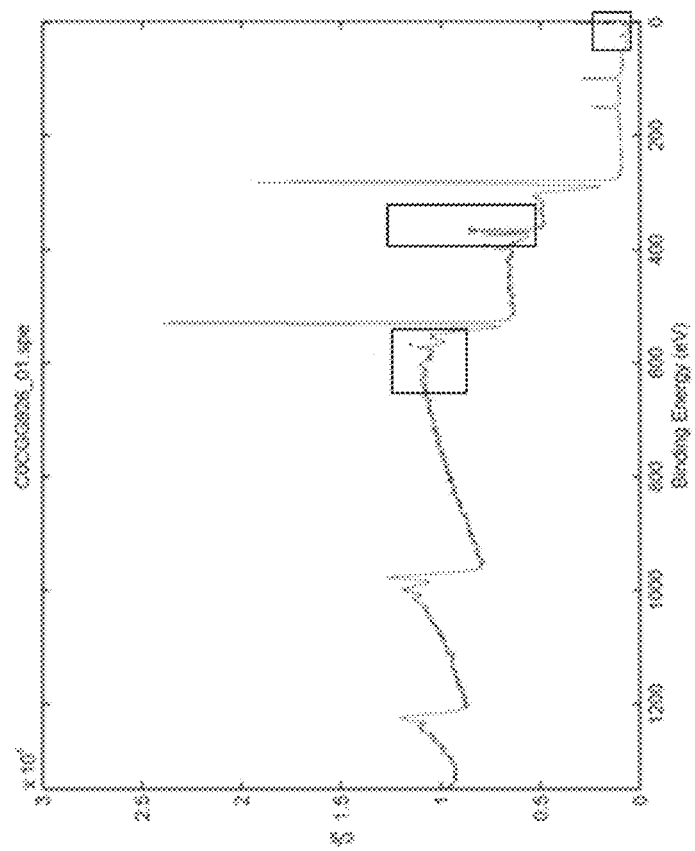

XPS (X-Ray Photoelectron Spectroscopy) was performed on sample 42 before and after the sintering and the results are shown in FIG. 12A and FIG. 12B respectively. As indicated by the arrows and circles in FIG. 12B, shell material has formed after the sintering process. The intensity of the peaks corresponding to different elements in the samples were further analyzed and listed in Table 6 below.

TABLE 6

|  | C | N | O | F | Si | Ag |
|---|---|---|---|---|---|---|
| Before sintering | 68.1 | 1.7 | 25.3 | — | 4.2 | 0.7 |
| After sintering | 64.6 | 2.2 | 27.8 | 1.2 | 3.4 | 0.9 |

Figure 13B:
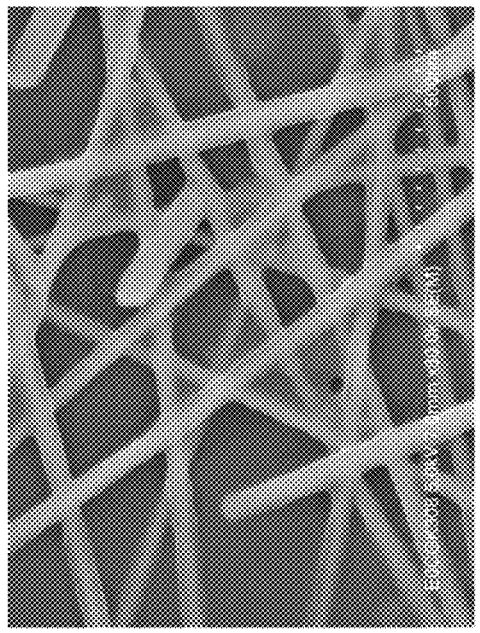
FIGS. 13B-13D are SEM of sample 42 at different magnifications after sintering.
Figure 13D:
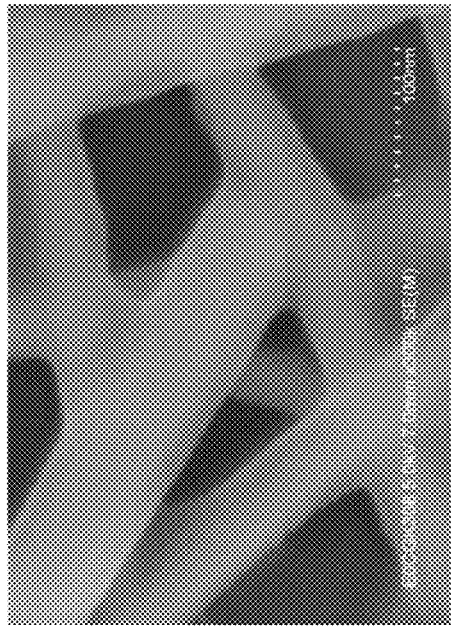
Figure 13A:
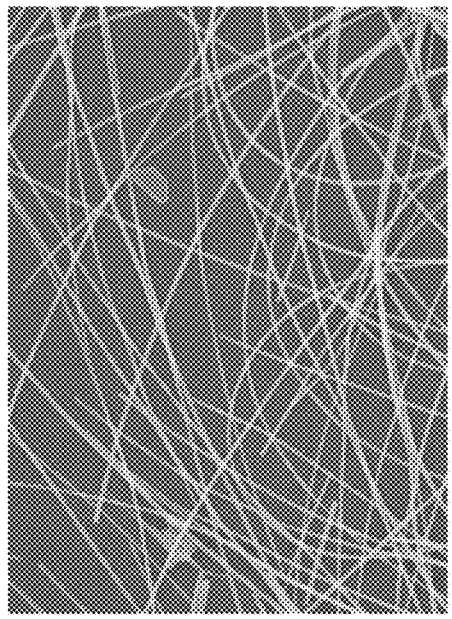
FIG. 13A is SEM of sample 42 before sintering.
Figure 13C:
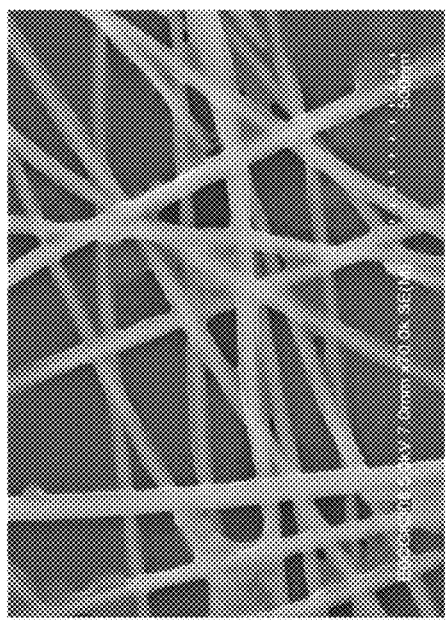

The sample was further analyzed by SEM and the results are shown in FIGS. 13A-13D with FIG. 13A showing the material before sintering and FIGS. 13B-13D showing the films after sintering. Difference in intensities (brightness) from SEM is indicative of materials with different conductivities (σ) and densities (ρ) with $\rho_{core}$~1.7 $\rho_{shell}$, $\sigma_{core} \gg \sigma_{shell}$, based on the values of the bulk materials. Thus, the SEM photos provide confirmation of the presence of a core-shell structure after performing the sintering.

The reflection off the core material only is about 0.96 in bulk while the reflection off the shell material is 0.12 in bulk. Bulk silver chloride material is known to have a refractive index of about 2. This is consistent with the observation made by Bi et al. in Chem. Commun. 2009, 6551-6553 entitled "In situ oxidation synthesis of Ag/AgCl core-shell nanowires and their photocatalytic properties", where the absorption decreases as an AgNW is converted to an AgCl nanowire which translates into high transmission with the conversion of Ag to Ag/AgCl core-shell type of structure. Bi et al. described a synthesis method for AgCl/Ag core-shell nanowire to study photocatalytic behavior of these synthesized materials. The process disclosed by Bi et al takes about 40 min and no discussion about using the material as potential transparent conductor was made. Sun et al. in Materials Letters 61 (2007) 1645-1648 entitled "AgCl nanoparticle nanowires fabricated by template method" described methods for making AgCl nanowires and AgCl nanoparticle-nanowires. Sun et al. however, does not discuss the formation of a core-shell type structure or using the material as potential transparent conductor. In fact, currently, there is no existing publication on using AgF/Ag or AgCl/Ag core-shell materials for transparent conductor applications. The core-shell material described herein is expected to have better optics, reflection and haze introduced by core-shell structure.

Figure 14:
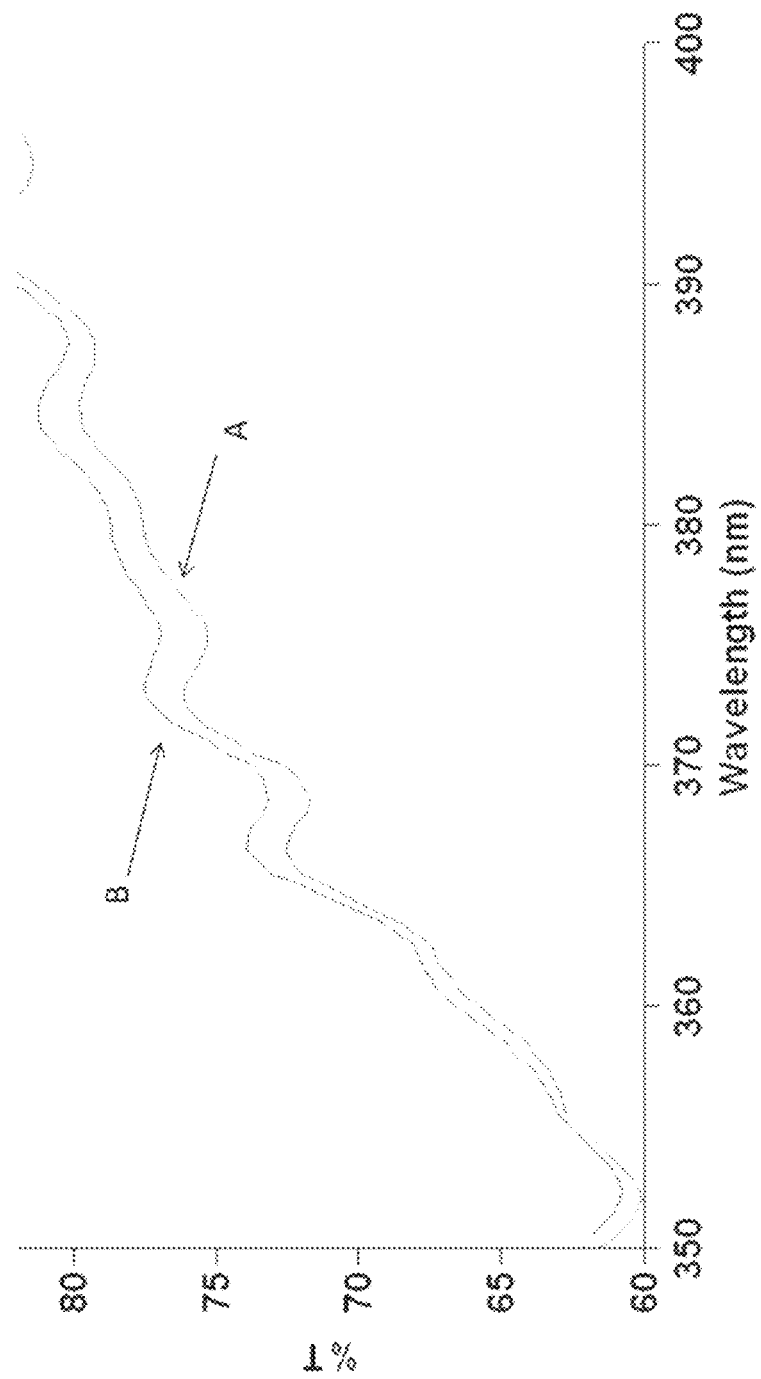
FIG. 14 is a plot of the optical absorption of a sample on PET showing the difference in surface plasmon resonance measurements of samples before and after HCl vapor sintering.

Surface Plasmon Resonance of samples before and after HCl vapor sintering was measured and the results plotted in FIG. 14 as A and B respectively for before and after samples. Reduction in Absorption (increase in transmission) has been observed for the after treatment sample B due to the reduction of Ag surface Plasmon resonance in sample B, which is consistent with the formation of the silver fluoride shell.

Example 8—AgNW Films with Patterned Areas Treated or not Treated with HCl Vapor

Half of AgNW film was treated with HCl and the properties of the untreated half and the treated half were measured and compared.

Commercially available silver nanowires (AgNWs) roughly 35 nm in diameter and 15-20 microns in length were dispersed in alcohols e.g. ethanol or isopropanol to form an AgNWs dispersion. The AgNWs dispersions have typically about 0.2 wt % concentration. The dispersion was then cast using a draw down Meyer Rod (rod 10) or blade coated (using ≈25 micron wet thickness) onto polyethylene terephthalate (PET) surfaces as AgNWs film samples 42 to 46 that are about 2×2 inches in size. Half of the sample film area "a", about 1×2 inches was selectively exposed to HCl vapor for about 5 seconds while the other half of the sample film area "b" was protected from the HCl exposure.

Figure 15:
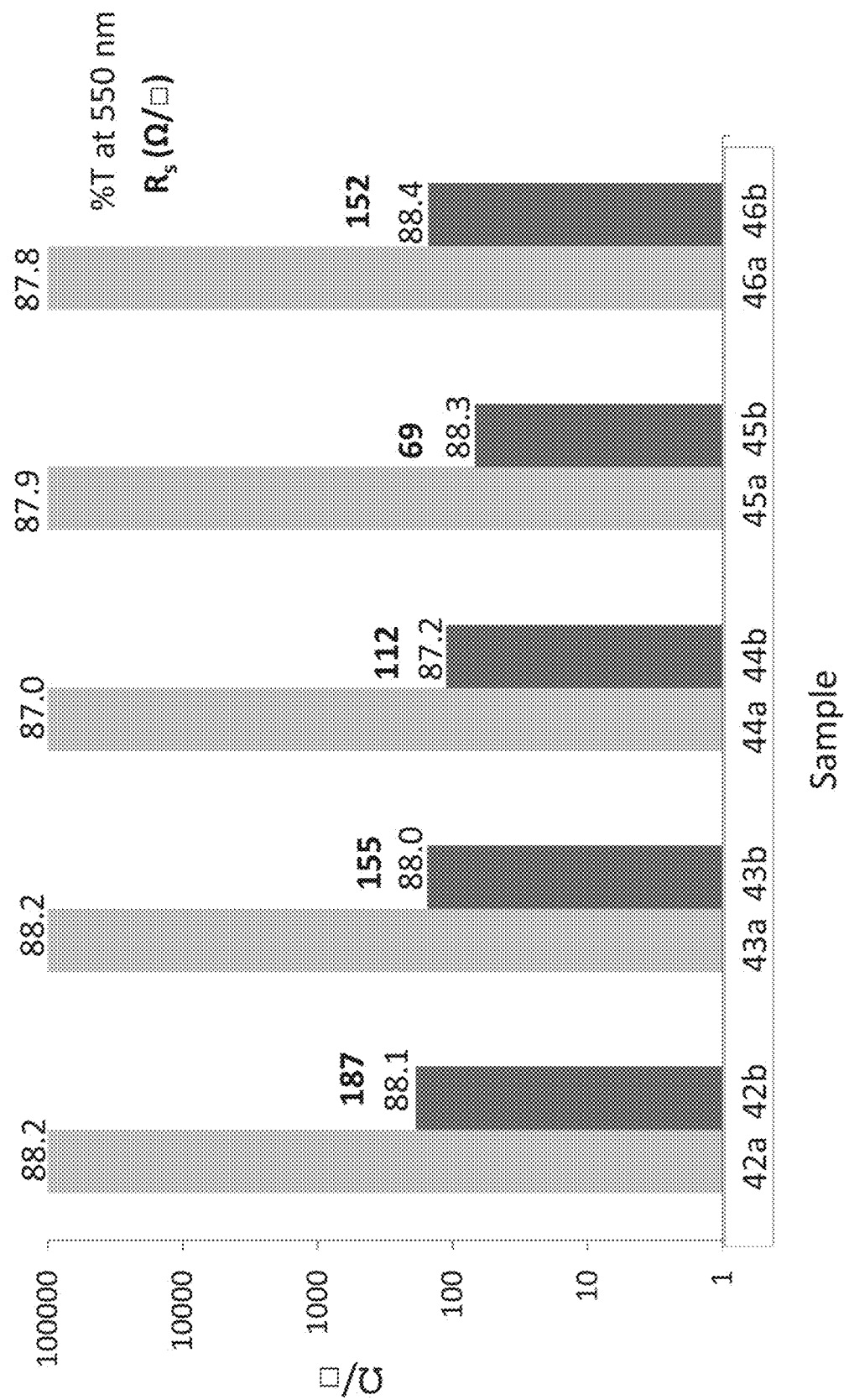
FIG. 15 is a plot of conductivity of the treated and untreated areas of film samples from Example 8 plotted in logarithmic scale.

The percentages of transmission (% T) at 550 nm and sheet resistance of the two areas were measured and the data are listed in Table 7 below. Sheet conductivity of the AgNWs film sample areas "a" and "b" with or without HCl exposure was measured using an R-Check hand-held 4 point probe or by making a perfect square and painting silver paste. The % T was obtained from the AgNW film only, i.e. the optical properties of the bare polymer substrate are subtracted away. The % TT (Total Transmission) of film is expected to be 1.5-2.0% higher than the % T value. Aside from the very close values in % T, visibly it is very difficult to distinguish between the sintered and non-sintered areas on the same film. The conductivity of the areas "a" and "b" of the film samples were plotted in FIG. 15 with the conductivity in logarithmic scale. As shown in FIG. 15, the difference in resistance is >$10^4$ of areas "a" and "b" treated or not treated with HCl vapor sintering agent.

TABLE 7

| Sample/Area | Sintered? | Ω/□ | % T |
|---|---|---|---|
| 42a | NO | >100k | 88.2 |
| 42b | YES | 187 | 88.1 |
| 43a | NO | >100k | 88.2 |
| 43b | YES | 155 | 88.0 |
| 44a | NO | >100k | 87.0 |
| 44b | YES | 112 | 87.2 |
| 45a | NO | >100k | 87.9 |
| 45b | YES | 69 | 88.3 |
| 46a | NO | >100k | 87.8 |
| 46b | YES | 152 | 88.4 |

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A touch sensor comprising a first electrode structure and a second electrode structure spaced apart in a natural configuration from the first electrode structure, the first electrode structure comprising a first transparent conductive electrode on a first substrate comprising a transparent sheet, wherein the first transparent conductive electrode comprises a first fused nanostructured metal network, wherein the first transparent conductive electrode having a transmittance of at least about 90% and comprises conductive regions with a sheet resistance of no more than about 100 ohms/sq.

2. The touch sensor of claim 1 wherein the second electrode structure comprises a second transparent conductive electrode on a second substrate wherein the second transparent conductive electrode comprises a second fused nanostructured metal network.

3. The touch sensor of claim 1 wherein the first electrode structure and the second electrode structure are spaced apart by a dielectric layer and further comprising a circuit connected to the conductive electrode structures that measures changes in capacitance.

4. The touch sensor of claim 1 further comprising display components associated with the substrate.

5. The touch sensor of claim 1 wherein the first substrate comprises a transparent polymer sheet.

6. The touch sensor of claim 1 further comprising a circuit connected to the electrode structures that measures changes in electrical resistance.

7. The touch sensor of claim 1 wherein the first transparent conductive electrode is patterned with conductive regions and non-conductive regions.

8. The touch sensor of claim 1 wherein the first transparent conductive electrode comprises conductive regions with a sheet resistance of no more than about 90 ohms/sq.

9. The tough sensor of claim 1 wherein the dielectric layer is a polymer sheet.

10. The touch sensor of claim 1 wherein the first transparent conductive electrode has a transmittance of at least about 92%.

11. A patterned structure comprising a substrate and a coating, wherein the coating is patterned to form a selected non-conductive portion over the surface and a conductive portion along the surface comprising a fused nanostructured metal network, wherein the conductive portion has a transmittance to visible light of at least about 85% and wherein the coating portion with the fused nanostructured metal network has a sheet resistance of no more than about 120.

12. The patterned structure of claim 11 wherein the coating portion with the fused nanostructured metal network has a sheet resistance of no more than about 100 Ohms/square and the non-conductive portion has a sheet resistance at least about 100 times the sheet resistance of the fused nanostructured metal network.

13. The patterned structure of claim 11 wherein the coating has a transmittance to visible light of at least about 92%.

14. The patterned structure of claim 11 wherein the coating has approximately the same transparency across the entire coating.

15. The patterned structure of claim 11 wherein the non-conductive portion has a sheet resistance at least about 1000 times the sheet resistance of the fused nanostructured metal network.

16. The patterned structure of claim 11 wherein the non-conductive portion of the coating comprises silver nanowires.

17. The patterned structure of claim 11 wherein the substrate is a polymer sheet.

18. The patterned structure of claim 11 wherein the sheet resistance of the fused metal nanostructured network is no more than about 100 ohms/sq.

19. The patterned structure of claim 18 wherein the transmittance to visible light is at least about 90%.

20. The patterned structure of claim 11 wherein the coating has a haze of no more than about 0.4%.

21. The patterned structure of claim 11 wherein the non-conductive portion comprises unfused metal nanowires.

* * * * *

UNITED STATES PATENT AND TRADEMARK OFFICE
CERTIFICATE OF CORRECTION

PATENT NO. : 10,781,324 B2  
APPLICATION NO. : 15/886201  
DATED : September 22, 2020  
INVENTOR(S) : Ajay Virkar et al.

Page 1 of 1

It is certified that error appears in the above-identified patent and that said Letters Patent is hereby corrected as shown below:

On the Title Page

Column 1, under "Related U.S. Application Data", delete "(60)" and insert -- (62) --, therefor.

On Page 3, Column 2, Item (56), under "OTHER PUBLICATIONS", Lines 32-33, delete "Nanowwire" and insert -- Nanowire --, therefor.

On Page 3, Column 2, Item (56), under "OTHER PUBLICATIONS", Line 38, delete "Tempature,'" and insert -- Temperature," --, therefor.

On Page 3, Column 2, Item (56), under "OTHER PUBLICATIONS", Line 45, delete "Sefl-welding" and insert -- Self-welding --, therefor.

On Page 3, Column 2, Item (56), under "OTHER PUBLICATIONS", Line 62, delete "Hydrogenls" and insert -- Hydrogels --, therefor.

On Page 4, Column 1, Item (56), under "OTHER PUBLICATIONS", Line 1, delete "al." and insert -- al., --, therefor.

On Page 4, Column 2, Item (56), under "OTHER PUBLICATIONS", Line 14, delete "Elservier" and insert -- Elsevier --, therefor.

In the Claims

In Column 24, Claim 9, Line 29, delete "tough" and insert -- touch --, therefor.

In Column 24, Claim 12, Line 44, delete "Ohms/" and insert -- ohms/ --, therefor.

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*